United States Patent
Gilbert et al.

(10) Patent No.: US 6,635,528 B2
(45) Date of Patent: Oct. 21, 2003

(54) METHOD OF PLANARIZING A CONDUCTIVE PLUG SITUATED UNDER A FERROELECTRIC CAPACITOR

(75) Inventors: Stephen R. Gilbert, San Francisco, CA (US); Scott Summerfelt, Cupertino, CA (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/741,675

(22) Filed: Dec. 19, 2000

(65) Prior Publication Data

US 2001/0044205 A1 Nov. 22, 2001

Related U.S. Application Data

(60) Provisional application No. 60/171,755, filed on Dec. 22, 1999.

(51) Int. Cl.[7] .................. H01L 21/00; H01L 21/8242
(52) U.S. Cl. ..................... 438/253; 438/3; 438/240; 438/396
(58) Field of Search ..................... 438/3, 238, 240, 438/253–256, 381, 396–399

(56) References Cited

U.S. PATENT DOCUMENTS

| | | | | |
|---|---|---|---|---|
| 5,739,563 A | * | 4/1998 | Kawakubo et al. | 257/295 |
| 5,851,896 A | * | 12/1998 | Summerfelt | 438/396 |
| 5,998,250 A | * | 12/1999 | Andricacos et al. | 438/240 |
| 6,001,660 A | * | 12/1999 | Park et al. | 438/3 |
| 6,030,847 A | * | 2/2000 | Fazan et al. | 438/3 |
| 6,066,528 A | * | 5/2000 | Fazan et al. | 438/253 |
| 6,190,965 B1 | * | 2/2001 | Clampitt | 438/255 |
| 6,218,258 B1 | * | 4/2001 | Joo | 438/396 |
| 6,348,709 B1 | * | 2/2002 | Graettinger et al. | 257/311 |

* cited by examiner

Primary Examiner—Carl Whitehead, Jr.
Assistant Examiner—Thanh Nguyen
(74) Attorney, Agent, or Firm—Frederick J. Telecky, Jr.; W. James Brady, III

(57) ABSTRACT

An embodiment of the instant invention is a method of fabricating a planar conductive via in an opening through a dielectric layer having a top surface, a bottom surface and the opening having sides, the method comprising the steps of: depositing a first conductive material (114 of FIG. 7d) on the top surface of the dielectric layer and in the opening in the dielectric layer to substantially fill the opening with the conductive material; removing the portion of the first conductive material located on the dielectric layer and removing a portion of the first conductive material located in the opening in the dielectric layer to recess (406 of FIG. 7d) the first conductive material below the top surface of the dielectric layer; depositing a second conductive material (704 of FIG. 7d) in the recess to form a substantially planar top surface substantially coplanar with the top surface of the dielectric layer; and forming a third conductive material (302 of FIG. 7d) on the second conductive material, at least one of the second conductive material and the third conductive material acting as a diffusion barrier to prevent oxidation of the first conductive material.

8 Claims, 6 Drawing Sheets

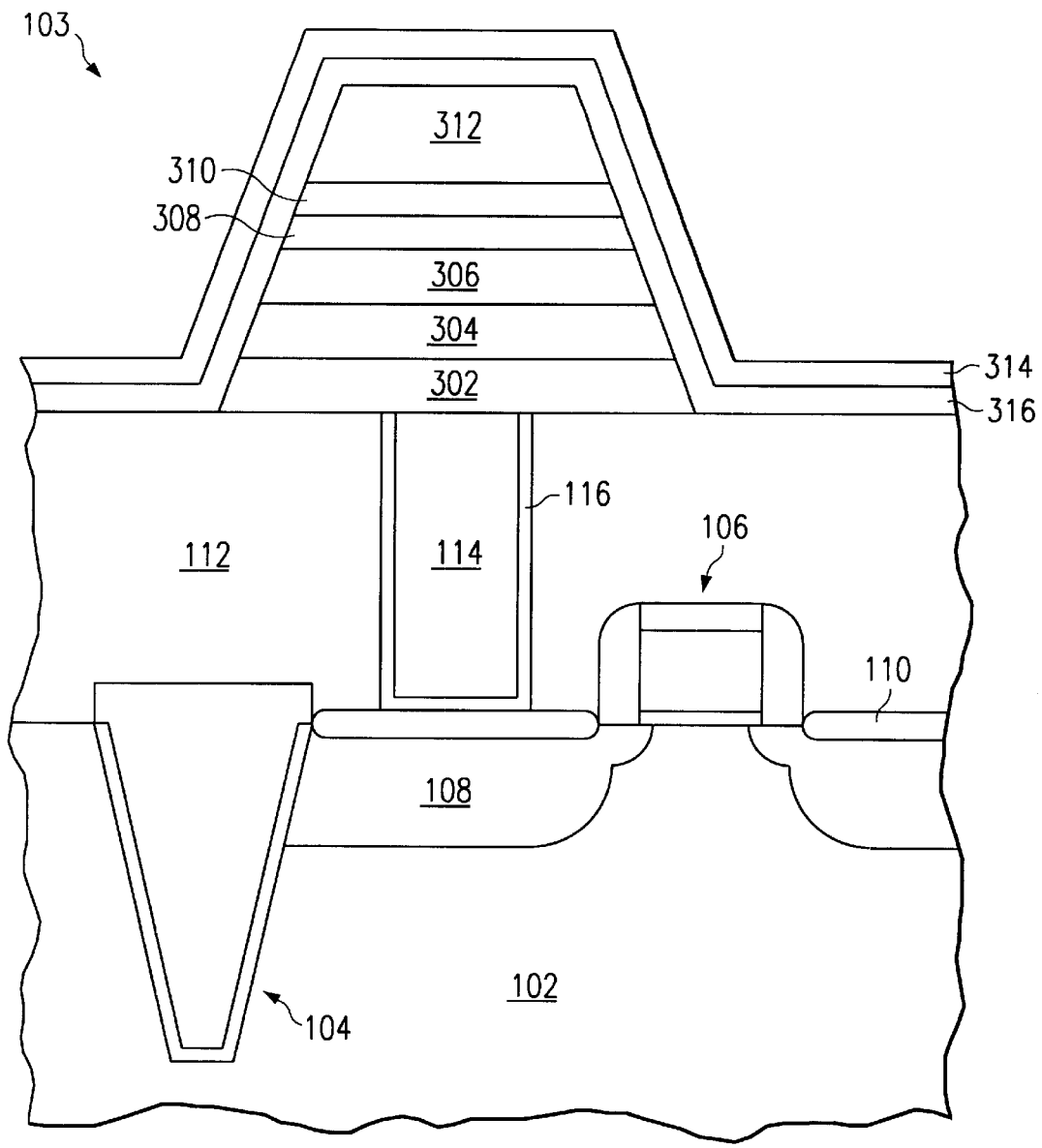
FIG. 3C
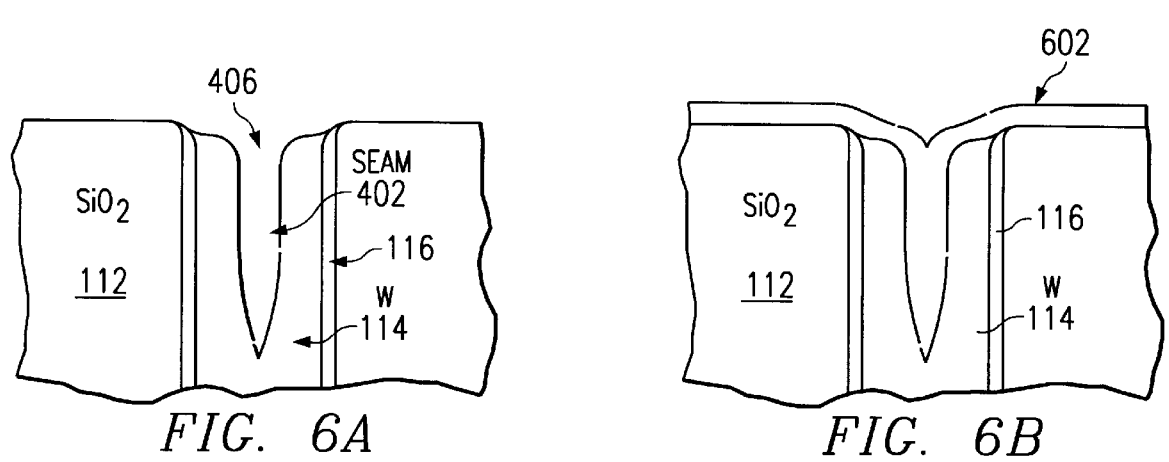
FIG. 6A
FIG. 6B

METHOD OF PLANARIZING A CONDUCTIVE PLUG SITUATED UNDER A FERROELECTRIC CAPACITOR

CROSS-REFERENCE TO RELATED PATENT/PATENT APPLICATIONS

This application claims priority under 35 USC §119 (e)(1) of Provisional Application No. 60/171,755, filed Dec. 22, 1999.

The following commonly assigned patent/patent applications are hereby incorporated herein by reference:

| Pat. No. /Ser. No. | Filing Date |
|---|---|
| S.N. 09/952,468 | 9/14/2001 |
| S.N. 09/741,650 | 12/19/2000 |
| S.N. 09/702,985 | 10/31/2000 |
| S.N. 09/741,677 | 12/19/2000 |
| S.N. 09/741,688 | 12/19/2000 |
| U.S. Pat. No. 6,211,035 | 09/09/1999 |
| U.S. Pat. No. 6,153,490 | 06/26/1998 |
| U.S. Pat. No. 6,171,970 | 01/27/1999 |

FIELD OF THE INVENTION

The instant invention pertains to semiconductor device fabrication and processing and more specifically to a method of fabricating a ferroelectric memory device.

BACKGROUND OF THE INVENTION

Several trends exist, today, in the semiconductor device fabrication industry and the electronics industry. Devices are continuously getting smaller and smaller and requiring less and less power. A reason for this is that more personal devices are being fabricated which are very small and portable, thereby relying on a small battery as its only supply source. For example, cellular phones, personal computing devices, and personal sound systems are devices which are in great demand in the consumer market. In addition to being smaller and more portable, personal devices are requiring more computational power and on-chip memory. In light of all these trends, there is a need in the industry to provide a computational device which has memory and logic functions integrated onto the same semiconductor chip. Preferably, this memory will be configured such that if the battery dies, the contents of the memory will be retained. Such a memory device which retains its contents while power is not continuously applied to it is called a non-volatile memory. Examples of conventional non-volatile memory include: electrically erasable, programmable read only memory ("EEPROM") and FLASH EEPROM.

A ferroelectric memory (FeRAM) is a non-volatile memory which utilizes a ferroelectric material, such as strontium bismuth tantalate (SBT) or lead zirconate titanate (PZT), as a capacitor dielectric situated between a bottom electrode and a top electrode. Both read and write operations are performed for a FeRAM. The memory size and memory architecture effects the read and write access times of a FeRAM. Table 1 illustrates the differences between different memory types.

TABLE 1

| Property | SRAM | Flash | DRAM | FeRAM (Demo) |
|---|---|---|---|---|
| Voltage | >0.5 V | Read >0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | >$10^{15}$ | <$10^5$ | >$10^{15}$ | >$10^{13}$ |
| Read Time (single/multi bit) | <10 ns | <30 ns | <30 ns/<2 ns | 60 ns |
| Read Endurance | >$10^{15}$ | >$10^{15}$ | >$10^{15}$ | >$10^{13}$ |
| Added Mask for embedded | 0 | ~6–8 | ~6–8 | ~3 |
| Cell Size (F~metal pitch/2) | ~80 $F^2$ | ~8 $F^2$ | ~8 $F^2$ | ~18 $F^2$ |
| Architecture | NDRO | NDRO | DRO | DRO |
| Non volatile | NO | YES | NO | YES |
| Storage | I | Q | Q | P |

The non-volatility of an FeRAM is due to the bistable characteristic of the ferroelectric memory cell. Two types of memory cells are used, a single capacitor memory cell and a dual capacitor memory cell. The single capacitor memory cell (referred to as a 1T/1C or 1C memory cell) requires less silicon area (thereby increasing the potential density of the memory array), but is less immune to noise and process variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell is more stable than a 1C memory cell.

In a 1T/1C FeRAM cell there is one transistor and one storage capacitor. The bottom electrode of the storage capacitor is connected to the drain of the transistor. The 1T/1C cell is read from by applying a signal to the gate of the transistor (wordline) thereby connecting the bottom electrode of the capacitor to the source of the transistor (bitline). A pulse signal is then applied to the top electrode contact (plate line or drive line). The potential on the bitline of the transistor is, therefore, the capacitor charge divided by the bitline capacitance. Since the capacitor charge is dependent upon the bistable polarization state of the ferroelectric material, the bitline potential can have two distinct values. A sense amplifier is connected to the bitline and detects the voltage associated with a logic value of either 1 or 0. Frequently the sense amplifier reference voltage is a ferroelectric or non-ferroelectric capacitor connected to another bitline that is not being read. In this manner, the memory cell data is retrieved.

A characteristic of a ferroelectric memory is that a read operation is destructive in some applications. The data in a memory cell must be rewritten back to the memory cell after the read operation is completed. If the polarization of the ferroelectric is switched, the read operation is destructive and the sense amplifier must rewrite (onto that cell) the correct polarization value as the bit just read from the cell. This is similar to the operation of a DRAM. If the drive line voltage was small enough not to switch the ferroelectric then the read operation was not destructive. In general a non-destructive read requires a much larger capacitor than a destructive read and, therefore, requires a larger cell size.

A 2T/2C memory cell in a memory array couples to a bit line ("bitline") and the inverse of the bit line ("bitline-bar")

that is common to many other memory types (for example, static random access memories). Memory cells of a memory block are formed in memory rows and memory columns. The dual capacitor ferroelectric memory cell comprises two transistors and two ferroelectric capacitors. A first transistor couples between the bitline and a first capacitor. A second transistor couples between the bitline-bar and a second capacitor. The first and second capacitors have a common terminal or plate to which a signal is applied for polarizing the capacitors.

In a write operation, the first and second transistors of the dual capacitor ferroelectric memory cell are enabled to couple the capacitors to the complementary logic levels on the bitline and the bitline-bar line corresponding to a logic state to be stored in memory. The common terminal of the capacitors is pulsed during a write operation to polarize the dual capacitor memory cell to one of the two logic states.

In a read operation, the first and second transistors of the dual capacitor memory cell are enabled to couple the information stored on the first and second capacitors to the bitline and the bitline-bar line. A differential signal is generated across the bitline and the bitline-bar line by the dual capacitor memory cell. The differential signal is sensed by a sense amplifier which provides a signal corresponding to the logic level stored in memory.

A memory cell of a ferroelectric memory is limited to a finite number of read and write operations before the memory cell becomes unreliable. The number of operations that can be performed on a FeRAM memory is known as the endurance of a memory. The endurance is an important factor in many applications that require a nonvolatile memory. Other factors such as memory size, memory speed, and power dissipation also play a role in determining if a ferroelectric memory is viable in the memory market.

SUMMARY OF THE INVENTION

In essence, the instant invention relates to the fabrication of an FeRAM device that is either a stand-alone device or one which is integrated onto a semiconductor chip that includes many other device types. Several requirements either presently exist or may become requirements for the integration of FeRAM with other device types. One such requirement involves utilizing, as much as possible, the conventional front end and backend processing techniques used for fabricating the various logic and analog devices on the chip to fabricate this chip which will include FeRAM devices. In other words, it is beneficial to utilize as much of the process flow for fabricating these standard logic devices (in addition to I/O devices and potentially analog devices) as possible, so as not to greatly disturb the process flow (thus increase the process cost and complexity) merely to integrate the FeRAM devices onto the chip.

The following discussion is based on the concept of creating the ferroelectric capacitors in a FeRAM process module that occurs between the front end module (defined to end with the formation of tungsten, which has the chemical symbol W, contacts) and backend process module (mostly metallization). Other locations of the FeRAM process module have also been proposed. For example, if the FeRAM process module is placed over the first layer of metallization (Metal-1) then a capacitor over bitline structure can be created with the advantage that a larger capacitor can be created. One disadvantage of the approach is that either Metal-1 (the first metal layer on the chip, which is the one closest to the substrate) or local interconnect should be compatible with FeRAM process temperatures (for tungsten for example) or the FeRAM process temperature should be lowered to be compatible with standard metallization (Al~450 C, Cu and low dielectric constant materials ~400 C). This location has some advantages for commodity memory purposes but has cost disadvantages for embedded memory applications.

Another possible location for the FeRAM process module is near the end of the back-end process flow. The principal advantage of this approach is that it keeps new contaminants in the FeRAM module (Pb, Bi, Zr, Ir, Ru, or Pt) out of more production tools. This solution is most practical if the equipment used after deposition of the first FeRAM film is dedicated to the fabrication of the FeRAM device structures and, therefore, is not shared. However, this solution has the drawback of requiring FeRAM process temperatures compatible with standard metallization structures (suggested limitations discussed above). In addition, the interconnection of the FeRAM capacitor to underlying transistors and other needs of metallization are not compatible with a minimum FeRAM cell size.

The requirements for the other locations will have many of the same concerns but some requirements will be different.

The FeRAM process module is preferably compatible with standard logic and analog device front-end process flows that include the use of tungsten contacts as the bottom contact of the capacitor. The FeRAM thermal budget must also be low enough so that it does not impact the front end structures such as the low resistance structures (which includes the tungsten plugs and silicided source/drains and gates) required by most logic devices. In addition, transistors and other front end devices, such as diodes, are sensitive to contamination. Contamination from the FeRAM process module, either direct (such as by diffusion in the chip) or indirect (cross contamination through shared equipment), should be addressed so as to avoid transistor and diode degradation. The FeRAM devices and process module should also be compatible with standard backend process flow. Therefore the FeRAM process module should have minimum degradation of logic metallization's resistance and parasitic capacitance between metal and transistor. In addition, the FeRAM devices should not be degraded by the backend process flow with minimal, if any modification. This is a significant challenge since ferroelectric capacitors have been shown to be sensitive to hydrogen degradation and most logic backend process flows utilize hydrogen and/or deuterium in many of the processes (such as in the formation of $SiO_2$ and $Si_3N_4$, CVD tungsten deposition, $SiO_2$ via etch, and forming gas anneals).

Commercial success of FeRAM also requires minimization of embedded memory cost. Total memory cost is primarily dependent on cell size, periphery ratio size, impact of yield, and additional process costs associated with memory. In order to have cost advantage per bit compared to standard embedded memories such as embedded DRAM and Flash it is desirable to have FeRAM cell sizes that are similar to those obtained with standard embedded memory technology. Some of the methods discussed in this patent to minimize cell size include making the process flow less sensitive to lithography misalignment, forming the capacitor directly over the contact, and using a single mask for the capacitor stack etch. Some of the methods discussed in this patent, to reduce the added process cost, may require two additional masks for the FeRAM process module and a planar capacitor which reduces the complexity of the needed processes.

Although this patent focuses on using a planar capacitor, a three dimensional capacitor using post or cup structure can be fabricated using many of the same concepts and processes. The planar structure is illustrated because it uses a simpler process and is cheaper to make. The 3D capacitor is preferred when the planar capacitor area needed for minimum charge storage considerations limits the cell size. In this situation, the capacitor area enhancement associated with the 3D configuration allows a smaller planar cell size. DRAM devices have used this approach for many years in order to reduce cell area.

An embodiment of the instant invention is a method of fabricating a planar conductive via in an opening through a dielectric layer having a top surface, a bottom surface and the opening having sides, the method comprising the steps of: depositing a first conductive material on the top surface of the dielectric layer and in the opening in the dielectric layer to substantially fill the opening with the conductive material; removing the portion of the first conductive material located on the dielectric layer and removing a portion of the first conductive material located in the opening in the dielectric layer to recess the first conductive material below the top surface of the dielectric layer; depositing a second conductive material in the recess to form a substantially planar top surface substantially coplanar with the top surface of the dielectric layer; and forming a third conductive material on the second conductive material, at least one of the second conductive material and the third conductive material acting as a diffusion barrier to prevent oxidation of the first conductive material. Preferably, second conductive material acts as the diffusion barrier and the third conductive material forms the bottom electrode of a ferroelectric capacitor, and is comprised of: TiAlN, TiSiN, TaN, TiN, CrN, CrAlN, TaSiN, ZrN, HfN, or any combination or stack thereof. The third conductive material is, preferably, comprised of: iridium, iridium oxide, or any combination or stack thereof.

In an alternative embodiment, the step of forming a second conductive material in the recess so as to have a top surface which is substantially planar and substantially coextensive with the top surface of the dielectric layer is comprised of the steps of: forming the second conductive material in the recess and on the top surface of the dielectric layer, the second conductive material filling the recess; and polishing the second conductive material to remove substantially all of the second conductive material formed on the top surface of the dielectric layer and to planarize the second conductive material formed in the recess. Preferably, the first conductive material is comprised of: doped polycrystalline silicon, tungsten, titanium, titanium nitride, tantalum, tantalum nitride, copper, aluminum, or any combination or stack thereof, and the second conductive material is selected from the group consisting of: Ti, Ta, TaN, TiAlN, TaSiN, TiSiN, HfN, ZrN, HfAlN, CrN, TaAlN, CrAlN, $WSi_x$, $WSi_xN_y$, $TaSi_x$, $TiSi_x$, Ir, Pt, Ru, Pd, Rd, doped polycrystalline silicon, undoped polycrystalline silicon, and any combination or stack thereof. The third conductive material is, preferably, comprised of a conductor selected from the group consisting of: TiAlN, TiSiN, TaN, TiN, CrN, CrAlN, TaSiN, ZrN, HfN, or any combination or stack thereof.

BRIEF DESCRIPTION OF THE DRAWINGS

FIGS. 3a–3c are cross-sectional views of a partially fabricated ferroelectric memory device which is fabricated using the method of FIG. 2.

FIGS. 6a–6c is a cross-sectional view of a portion of a partially fabricated device illustrating the improved contact of another embodiment of the instant invention.

Similar reference numerals are used throughout the figures to designate like or equivalent features. The figures are not drawn to scale. They are merely provided to illustrate the affect of the method of the instant invention.

DETAILED DESCRIPTION OF THE DRAWINGS

While the following description of the instant invention revolves around the integration of the FeRAM devices with logic devices and other devices which can be found on a digital signal processor, microprocessor, smart card, microcomputer, microcontroller or system on a chip, the instant invention can be used to fabricate stand-alone FeRAM devices or FeRAM devices integrated into a semiconductor chip which has many other device types. In particular, the improved performance of the FeRAM device of the instant invention compared to standard semiconductor memories appears to make FeRAM the memory of choice for any handheld device which requires low power and large degree of device integration. The figures provided herewith and the accompanying description of the figures are merely provided for illustrative purposes. One of ordinary skill in the art should realize, based on the instant description, other implementations and methods for fabricating the devices and structures illustrated in the figures and in the following description. For example, while shallow trench isolation structures ("STI") are illustrated, any conventional isolation structures may be used, such as field oxidation regions (also known as LOCOS regions) or implanted regions. In addition, while structure 102 is preferably a single-crystal silicon substrate which is doped to be n-type or p-type, structure 102 (FIG. 1) may be formed by fabricating an epitaxial silicon layer on a single-crystal silicon substrate.

Figure 1:
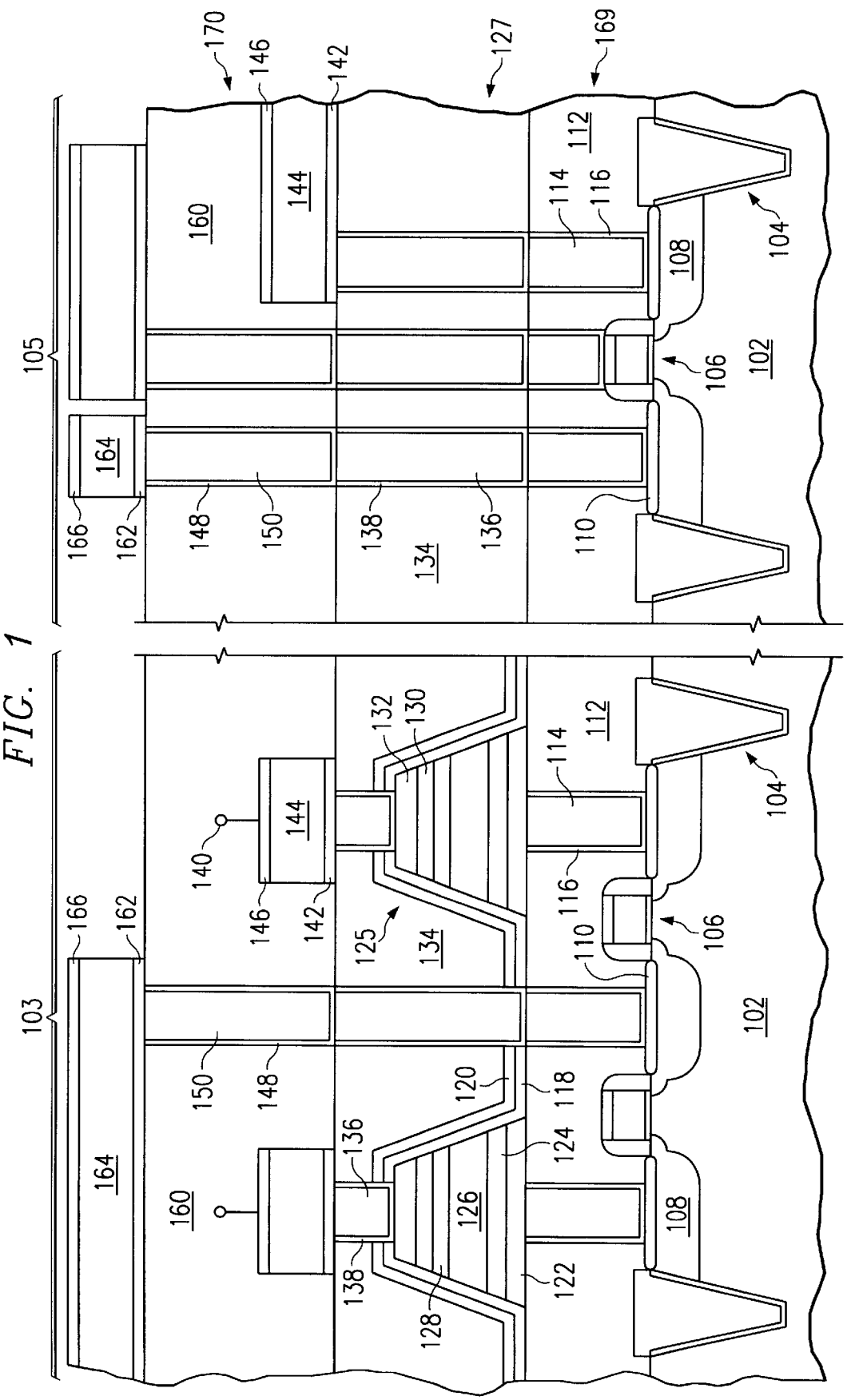
FIG. 1 is a cross-sectional view of a partially fabricated device which is fabricated using the method of one embodiment of the instant invention.

Referring to FIG. 1, two devices are illustrated in FIG. 1. Device 103 represents a partially fabricated version of a FeRAM cell of the instant invention, and device 105 represents any high-voltage transistor, low-voltage transistor, high-speed logic transistor, I/O transistor, analog transistor, or any other device which may be included in a digital signal processor, microprocessor, microcomputer, microcontroller or any other semiconductor device. Except for the specific cell structure provided in device 103, the structures utilized in device 103 should be the same as the device structures of device 105 (except for some possible variations in the transistors due to the different device types that device 105 may be).

Basically, gate structures 106 include a gate dielectric (preferably comprised of silicon dioxide, an oxynitride, a silicon nitride, BST, PZT, a silicate, any other high-k material, or any combination or stack thereof, a gate electrode (preferably comprised of polycrystalline silicon doped either p-type or n-type with a silicide formed on top or a metal such as titanium, tungsten, TiN, tantalum, TaN or a metal), and side wall insulators (preferably comprised of an oxide, a nitride, an oxynitride, or a combination or stack thereof). In general the generic terms oxide, nitride and oxynitride refer to silicon oxide, silicon nitride and silicon oxy-nitride. The term "oxide" may, in general, include doped oxides as well such as boron and/or phosphorous doped silicon oxide. Source/drain regions 108 are preferably implanted using conventional dopants and processing conditions. Lightly doped drain extensions as well as pocket implants may also be utilized. In addition, the source/drain regions 108 may be silicided (preferably with titanium, cobalt, nickel, tungsten or other conventional silicide material).

A dielectric layer 112 is formed over the entire substrate and is patterned and etched so as to form openings for contacts to the substrate and gate structures to be formed (step 202). These openings are filled with one or more conductive materials, such as plug 114 (preferably comprised of a metal such as tungsten, molybdenum, titanium, titanium nitride, tantalum nitride, metal silicide such as Ti, Ni or Co, copper or doped polysilicon). A liner/barrier layer may or may not be formed between the plug 114 and dielectric 112. A liner/barrier layer 116 is illustrated in FIG. 1 and is, preferably, comprised of Ti, TiN, TaSiN, Ta, TaN, TiSiN, a stack thereof, or any other conventional liner/barrier material. Preferably, the contacts will be formed so as to land on the silicided regions of the source/drain regions and gate structures.

The dielectric layer 112 is preferably comprised of $SiO_2$ (doped or undoped with preferable dopants such as boron or phosphorous) possibly with a layer of hydrogen or deuterium containing silicon nitride next to the gate. After deposition of the diffusion barrier it is likely that the barrier will be planarized for improved lithography of overlying layers using a process such as chemical mechanical polishing. In addition, an added diffusion barrier/etch stop might be included near the top surface of layer 112 such as $AlO_x$, AlN, $Si_3N_4$, $TiO_2$, $ZrO_2$, or $TaO_x$ that would be deposited after planarization process. This diffusion barrier is particularly useful if damascene processes are used to create the via or metallization to the contact. The formation of plug 114 will require etching through this optional barrier/etch stop.

Formation of metal structures which are situated above the contacts is considered to be part of the back end processes. Other than the specific FeRAM process module, the back end process steps should be those standard in the semiconductor industry. The metallization will, therefore, either be Al or Cu based. The Al is preferably etched while the Cu is preferably used in a damascene approach. However, etching Cu and Al formed in a damascene process is also possible. Aluminum metallization will preferably have CVD tungsten plugs or Al plugs, and the Al will preferably be Cu-doped for improved electromigration resistance. Metal diffusion barriers for Al preferably include TiN and/or Ti. Copper metallization will preferably have Cu or W plugs with either Ti, TiN, TiSiN, Ta, tantalum nitride, and/or TaSiN diffusion barriers. A thin dielectric layer (not shown) may be formed between each of the interlevel dielectric (ILD) layers (layers 112, 134 and 160). If formed, this thin layer is, preferably, comprised of a silicon nitride, silicon carbide, SiCNO or a silicon oxide (preferably a high-density plasma oxide). In addition, interlevel dielectric layers 112, 134, and 160 are, preferably, comprised of an oxide, FSG, PSG, BPSG, PETEOS, HDP oxide, a silicon nitride, silicon oxynitride, silicon carbide, silicon carbo-oxynitride, a low dielectric constant material (preferably SiLK, porous SiLK, teflon, low-K polymer (possibly porous), aerogel, xerogel, BLACK DIAMOND, HSQ, or any other porous glass material), or a combination or stack thereof. The interconnects and the metal lines are, preferably, comprised of the same material. Preferably, plugs 136 and 150 and conductors 144 and 164 are comprised of a metal material (preferably copper, aluminum, titanium, TiN, tungsten, tungsten nitride, or any combination or stack thereof. A barrier/liner may be formed between the plug and the interlevel dielectric layer. If formed, the barrier/liner layer (shown as layers 138 and 148 and liners 142, 146, 162 and 166) is, preferably, comprised of Ti, TiN, W, tungsten nitride, Ta, tantalum nitride, any conventional barrier/liner layer, or any combination or stack thereof). The interlayer dielectric and plug material should be compatible with the FeRAM thermal budget. With existing technology (i.e., one that incorporates a W plug and SiO2 ILD), the FeRAM thermal budget should be less than approximately 600 or 650 C. If the ILD is modified to include a low dielectric constant ("low K") layer, the FeRAM thermal budget will need to be reduced further. The preferred interlayer dielectric 112 is therefore a material that can withstand a thermal budget in excess of 600 C, such as silicon oxide (doped and/or undoped), silicon nitride, and/or silicon oxy-nitride.

Level 127 is added so as to accommodate the FeRAM cells (FeRAM process module). This FeRAM process module allows the creation of ferroelectric or high dielectric constant capacitors to be easily added with maximum thermal budget for the new process module yet not impact the thermal budget of backend process. In particular, this level allows FeRAM devices with capacitor under bitline configuration compatible with a high-density memory. However, it is possible, if planarity is not a necessity, to form the FeRAM devices while not forming layer 127 in region 105. Hence, the FeRAM portion 103 would be taller than the region 105 by the height of layer 127.

FeRAM capacitor 125 is comprised of several layers. Conductive barrier layer 122 may or may not be formed depending on whether plug 114 needs to be protected during subsequent processing of the capacitor dielectric. If formed, conductive barrier layer 122 is, preferably, comprised of TiAlN or other possible barriers (some of which have a slow oxidation rate compared to TiN) which include: TaSiN, TiSiN, TiN, TaN, HfN, ZrN, HfAlN, CrN, TaAlN, CrAlN, or any other conductive material. The thickness of this layer is, preferably, on the order of 60 nm (for a 0.18 um via). In the future, scaling the via size will allow scaling of the barrier thickness as well. The preferred deposition technique for these barrier layers is reactive sputter deposition using $Ar+N_2$ or $Ar+NH_3$. It should be noted that Ar is the standard inert gas used for sputter deposition or physical etching based on cost and performance. It is possible to use other inert gases instead of Ar for these applications throughout the process described in this document. Other deposition techniques that might be used include chemical vapor deposition (CVD) or plasma enhanced CVD (PECVD). CVD of nitrides actually results in carbo-oxy-nitrides especially when metalorganic precursors are used and this is also acceptable in many cases. For the preferred W contact it is preferred to deposit a bilayer diffusion barrier. First, CVD TiN (40 nm is preferred) is deposited followed by PVD TiAlN (30 nm preferred). Even more preferred would be CVD or PECVD deposition of TiAlN (~60 nm). The preferred proportion of aluminum in TiAlN is around 30–60% Al and 40–50% is more preferred in order to have improved oxidation resistance. A better diffusion barrier (such as the one of an embodiment of the instant invention) will, in general, allow the oxygen stable bottom electrode material to be thinner or a higher process temperature to be used.

The bottom electrode 124 of capacitor 125 is formed (step 206) either on barrier layer 122 or directly on layer 112 so as to make electrical connection with the underlying contact structure. Preferably, the bottom electrode is around 25–100 nm thick, is stable in oxygen, and is comprised of a noble metal or conductive oxide such as iridium, iridium oxide, Pt, Pd, PdOx, Au, Ru, $RuO_x$, Rh, $RhO_x$, $LaSrCoO_3$, $(Ba,Sr)RuO_3$, $LaNiO_3$ or any stack or combination thereof. For any electrode using noble metals, it is advantageous, from a cost and ease of integration standpoint, to use layers which are as thin as possible. The preferred bottom electrode for a PZT capacitor dielectric is either 50 nm Ir or a stack comprised of 30 nm IrOx and 20 nm Ir, which is preferably deposited by sputter deposition for Ir (Ar) and/or reactive sputter deposition (Ar+$O_2$) for IrOx. Lower ferroelectric deposition temperatures might allow even thinner electrodes, which would be preferred. The preferred deposition technique for these layers is sputter or reactive sputter deposition or chemical vapor deposition. In order to control the stress of the bottom electrode, a post bottom electrode anneal is, preferably, performed for stress relaxation and/or to improve the microstructure/stability of the bottom electrode. Typical anneal conditions are 400–600 C for 2–10 min in oxygen or inert gas mixture. This anneal may be performed at any time after the formation of the bottom electrode, but preferably prior to the formation of ILD 160

The capacitor dielectric is formed (step 208) on the bottom electrode. Preferably, the capacitor dielectric 126 is less than 150 nm thick (more preferably less than 100 nm thick—most preferably less than 50 nm thick) and is comprised of a ferro-electric material, such as $Pb(Zr,Ti)O_3$ (PZT—lead zirconate titanate); doped PZT with donors (Nb, La, Ta), acceptors (Mn, Co, Fe, Ni, Al), and/or both; PZT doped and alloyed with SrTiO3, BaTiO3 or CaTiO3; strontium bismuth tantalate (SBT) and other layered perovskites such as strontium bismuth niobate tantalate (SBNT); or bismuth titanate; BaTiO3; PbTiO3; or Bi2TiO3. PZT is the most preferable choice for the capacitor dielectric because it has the highest polarization and the lowest processing temperature of the aforementioned materials. In addition, the preferred Zr/Ti composition is around 20/80, respectively, in order to obtain good ferroelectric switching properties (large switched polarization and relatively square-looking hysteresis loops). Alternatively Zr/Ti compositions of approximately 65/35 may be preferred to maximize uniformity in capacitor properties. In all situations it is preferred to have donor doped PZT with roughly 0.05 to 1% donor dopant. The donor dopant improves the reliability of the PZT by helping to control the point defect concentrations. The preferred deposition technique for these dielectrics is metal organic chemical vapor deposition (MOCVD). MOCVD is preferred especially for thin films (i.e., films less than 100 nm thick). Thin PZT is extremely advantageous in making integration simpler (less material to etch), cheaper (less material to deposit therefore less precursor) and allows lower voltage operation (lower coercive voltage for roughly the same coercive electric field). The capacitor dielectric can be deposited in either a crystalline/poly-crystalline state or it can be deposited in an amorphous phase at low temperatures and then crystallized using a post-deposition anneal. This is commonly done for Bi ferroelectric films. The post deposition crystallization anneal can be performed immediately after deposition or after later process steps such as electrode deposition or post capacitor etch anneal. The preferred MOCVD PZT approach results in a poly-crystalline film deposited at temperatures preferably between 450–600 C (more preferred between 500 and 550 C).

The top electrode is formed (step 210) on the capacitor dielectric 126. In this embodiment of the instant invention, the top electrode is illustrated as layer 128 and 130. However, the top electrode can be implemented in just one layer. Preferably, layer 128 is comprised of iridium oxide (preferably less than 100 nm thick—more preferably less than 50 nm thick) and layer 130 is comprised of iridium (preferably less than 100 nm thick—more preferably less than 50 nm thick). In particular it is advantageous for Pb based ferroelectrics to have a conductive oxide top electrode such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ rather than a pure noble metal so as to minimize degradation due to many opposite state write/read operations (fatigue). Many of the Bi-containing ferroelectrics, such as SBT, can also use noble metal electrodes such as Pt, Pd, Au, Ag, Ir, Rh, and Ru and still retain good fatigue characteristics. If the top electrode is an oxide, it is advantageous to have a noble metal layer above it in order to maintain low contact resistance between the top metal contact and oxide. For example, it is possible that a TiN layer in contact with IrOx might form $TiO_2$, which is insulating, during subsequent thermal processes. For any electrode using an expensive noble metal such as Pt, Ru, Pd, or Ir, it is advantageous, from a cost and integration standpoint, to use as thin of layer as possible. For PZT electrodes, the preferred top electrode stack is comprised of approximately 10 nm Ir deposited by PVD in Ar on approximately 20 nm IrOx deposited by reactive PVD in Ar+$O_2$ on top of the PZT capacitor dielectric. IrOx is preferred to be deposited below 400 C in gas mixtures of between 50% and 80% $O_2$ with the rest argon with a relatively low sputter power and hence slow deposition rate (preferred to be less than 20 nm/min). It is possible to anneal the top electrode prior to deposition of the hardmask in order to control the stress in the top electrode. For example, sputter deposited electrodes will typically be subject to compressive stress while, the stress in annealed electrode will be tensile.

Preferably, the entire capacitor stack is patterned and etched (step 214) at one time, preferably using different etchant for some of the layers, but each layer or grouping of layers can be etched prior to the formation of the subsequent layer or layers. If multiple layers or all of the layers are etched simultaneously, then a hard mask layer 132 is, preferably, formed (step 212) over the stack. Preferably, the hard mask is comprised of a material which is thick enough so as to retain its integrity during the etch process. The hardmask is, preferably, around 50 to 500 nm thick (more preferably around 100 to 300 nm thick—most preferably around 200 nm thick) and is comprised of TiAlN, TiN, Ti, $TiO_2$, Al, AlOx, AlN, TiAl, TiAlOx, Ta, TaOx, TaN, Cr, CrN, CrOx, Zr, ZrOx, ZrN, Hf, HfN, HfOx, silicon oxide, low-k dielectric, or any stack or combination thereof. An example of a hardmask stack is 300 nm of PECVD deposited SiO2 on 50 nm of sputter deposited TiAlN or TiN. The hardmask thickness is controlled by the etch process and the relative etch rates of the various materials, the thicknesses of the etched layers, the amount of overetch required, and the desired remaining hardmask thickness after etching all of the layers. Thinner layers result in thinner hardmasks. The hardmask may or may not be removed after the etching of the capacitor stack. If hardmask 132 is not removed, then it is preferable to form the hardmask of a conductive material. However, a non-conductive or semiconductive material may be used, but the interconnection to the top electrode of the capacitor should preferably be formed through this hard mask so as to make direct connection to the top electrode.

The deposition of the hardmask may be a single or multilayer stack of different materials in order to better control the hardmask profile and remaining hardmask thickness. The preferred deposition process for metal nitride hard masks is sputter deposition using $Ar+N_2$ gas mixtures. The preferred deposition process for silicon oxide containing hardmasks is TEOS PECVD.

After the contact formation, several different deposition steps have been described. In particular, bottom diffusion barrier, bottom electrode, ferroelectric, top electrode and hardmask. It is likely that all or nearly all of the pieces of equipment used in these process steps will be considered potentially contaminated by ferroelectric elements. Therefore these pieces of equipment will be considered dedicated. The wafers will most likely have a significant, if not a high, contamination level on the backside of the wafers. The next process step after hardmask deposition is typically lithography. It is likely that processing wafers with backside contamination through this tool will contaminate the tool and hence result in contamination of clean wafers processed through this tool with FeRAM contaminates on their backside. Therefore, it is preferred to clean the backsides of the FeRAM wafers so as to be able to share the lithography equipment and allow clean wafers to be processed through the lithography equipment without any FeRAM contamination. If the hardmask includes standard materials such as SiO2 then the backside of the wafers might be cleaned prior to deposition of this later part of the hardmask. For example, if the hardmask is comprised of $SiO_2$ on TiAlN then it is preferred to clean the backside of the wafer after the TiAlN deposition process and before the $SiO_2$ deposition process. This will prevent the $SiO_2$ deposition tool from being contaminated, and, hence, allow it to be shared. The cleaning process depends on the backside contamination elements and their contamination levels. Assuming the preferred approach (PVD barrier, hardmask, bottom electrode, top electrode and MOCVD PZT) there will be low levels of Ir on the backside but continuous films assuming the MOCVD process does not have edge exclusion. Therefore for this type of wafer contamination the preferred backside wafer clean process is wet etch process that etches the back, edges and small region on the frontside of the wafer near the edge. The etch process is somewhat dependent on the materials present on the backside of the wafer (for example if it is Si, $SiO_2$ or $Si_3N_4$). Wet etching PZT preferably is accomplished using either a strong fluorine acid or an acid mixture with chlorine and fluorine etch chemistries, such as $H_2O+HF+HCl$ or $H_2O+NH_3F+HCl$.

It is preferred to perform the pattern and etch process for the capacitor stack with only one lithography step. This is not only cheaper but also allows the cell size to be smaller by eliminating misalignment tolerances which are necessary if more than one lithography step is used. As mentioned before, the preferred approach is to use a hardmask with multiple etch processes. These etch process can be modified by using elevated temperatures in order to achieve even steeper sidewall slopes and, therefore, less critical dimension (CD) growth. In general, it is preferred to minimize CD growth and this can be achieved by having a steeper etch profile and/or by having thinner layers. The low temperature etch process of one embodiment of the instant invention which utilizes a hardmask achieves sidewall slopes of roughly 74 degrees for the PZT and Ir structures, while the TiAlN structure profile is steeper. The etch rate of Ir and PZT (slow etch rate materials) is roughly 100 nm/min.

The etch process is a dirty process and hence it is likely that the etch tool and the frontside, edge and backside of the wafers will have FeRAM contamination or have etch residues with FeRAM contamination. It is, therefore, necessary to clean the frontside of the wafer and chemically remove etch residues and possibly remove a thin layer of damaged PZT. This post-capacitor-etch wet-clean may, with some etch conditions and chemistries, be as simple as a deionized water (DI water or DIW) clean (tank soak with or without megasonic followed by a spin rinse dry) or the tank etch might be acid-based in order to improve the clean or remove more damage. The etch process can also result in redeposition of conductive layers of hard to etch materials such as noble metals on the sidewall. For example, with Ir bottom electrodes it is possible to redeposit Ir on the sidewalls of the PZT which would result in unacceptably high leakage current for the capacitor. The wet clean (step 216) can be used to also remove this unwanted material using chemistries that etch a little of the ferroelectric material and also will keep the unwanted material in solution. The backside and edges of the wafer are likely to be significantly contaminated by redeposition of FeRAM elements. They should be removed prior to process in a shared tool.

The capacitor etch results in damage or degradation of the ferroelectric which needs to be recovered. One method (step 216) to recover this damage is by $O_2$ plasma exposure (to recover any oxygen loss that might have occurred) and/or a RTA or furnace anneal in an inert or oxidizing atmosphere (to add oxygen and to improve the crystallinity of the damaged surfaces created by the etch process. For PZT this anneal is preferably performed around 500–650 C (for a furnace anneal the duration is preferably around 15 min to 2 hr) or 550–700 C (for a RTA the duration is preferably around 10 sec to 60 sec).

The sidewalls of the capacitor are, preferably, fairly steep. A sidewall diffusion barrier is, preferably, formed (step 218) on the capacitor stack prior to the formation of layer 134 and the etching of the interconnection holes. The sidewall diffusion barrier is important because it allows for the misalignment of the interconnect without shorting the capacitor, it protects the capacitor from the diffusion of most substances into the capacitor, and it protects the rest of the structures from the out-diffusion of substances from the capacitor. In this embodiment of the instant invention, the sidewall diffusion barrier is illustrated as two layers (layers 118 and 120), but the sidewall diffusion barrier may be comprised of more or fewer layers. Preferably, layer 118 is around 30 nm thick and is comprised of $AlO_x$, $Ta_2O_5$, AlN, $TiO_2$, $ZrO_2$, $HfO_2$, or any stack or combination thereof; and layer 120 is around 30 nm thick and is comprised of silicon nitride, AlN, or any stack or combination thereof. The preferred process for depositing the metal oxides or nitrides (which can also be carbo-oxy-nitrides especially when metalorganic precursors are used) is MOCVD under conditions with minimal free hydrogen (i.e., enough oxygen such that $H_2O$ is formed rather than $H_2$). It is also possible to use plasma enhanced CVD or MOCVD process. Alternatively reactive sputter deposition can be used with either $Ar+O_2$ (for oxides), $Ar+N_2$ (for nitrides) or $Ar+O_2+N_2$ (for oxynitrides). The preferred process for silicon nitride is CVD or PECVD. For low hydrogen process the process gases should be $SiH_4$ and $N_2$, where the flow rate of $N_2$ is much greater than that of SiH$_4$. For a hydrogen free PECVD Si$_3$N$_4$ deposition process then SiCl$_4$+N$_2$ should be used and, again, it is beneficial to have flow rate of N$_2$ which is much greater than that of SiCl$_4$. For the preferred embodiment listed here, the AlOx layer is used as a Pb and H diffusion barrier while the Si$_3$N$_4$ layer is used as a contact etch stop.

If the via etch can be modified so that it stops on the sidewall layer (AlOx for example) then it is the etch stop and an additional layer (i.e. Si3N4) is not necessary. In this case, the thickness of the sidewall might need to be increased.

An alternative approach is to etch back the sidewall material after deposition. This etchback can be done after deposition of the diffusion barrier layer(s). In one preferred embodiment AlOx (approximately 40 nm is preferred) is deposited followed by an etchback using chlorine containing etch gas (BCl$_3$ or Cl$_2$ for example) followed by PECVD deposition of Si$_3$N$_4$ (approximately 30 nm is preferred).

If the etch damage has not yet been healed by an anneal, then the anneal can be performed after sidewall diffusion barrier deposition. For PZT this anneal is, preferably, performed around 500–650 C (for a furnace anneal for around 15 min to 2 hr) or 550–700 C (for a RTA for around 10 sec to 60 sec). Even more preferred is a RTA at 650 C for 1 min. This option is preferred if the choice of interlayer dielectric layer that is formed directly above the ferroelectric capacitor, is a low-K material with a maximum thermal budget of less than around 500 C. This anneal can be performed in an oxidizing or inert atmosphere conditions.

At the beginning of the AlOx deposition process, the front side of the wafer has exposed FeRAM elements. The AlOx deposition process may or may not result in contamination of the tool (defined to be additional FeRAM contaminants on subsequent wafers at levels above care-about-level, which is around 10$^{10}$ atoms/cm$^2$). If the AlOx deposition process on FeRAM wafers does not result in contamination then it is preferred to wet clean the backside of the wafer prior to depositing this sidewall diffusion barrier. If the AlOx deposition process on FeRAM wafers does result in tool contamination then the preferred backside clean can be done after this step. The wet chemistry used to clean the backside of the wafer might be different from that used the first time since the contamination of the backside is expected to have different elemental concentration levels.

Above the sidewall diffusion barrier an interlayer dielectric(s) are deposited (step 220). A thin dielectric layer (not shown) may be formed between each of the interlevel dielectric layers (layers 112, 134 and 160). If formed, this thin layer is, preferably, comprised of a silicon nitride, silicon carbide, (SiCNO) or an siliconoxide (preferably a high-density plasma oxide). In addition, interlevel dielectric layers 112, 134, and 160 are, preferably, comprised of an oxide, FSG, PSG, BPSG, PETEOS, HDP oxide, a silicon nitride, silicon oxynitride, silicon carbide, silicon carbo-oxy-nitride, a low dielectric constant material (preferably SiLK, porous SiLK, teflon, low-K polymer (possibly porous), aerogel, xerogel, BLACK DIAMOND, HSQ, or any other porous glass material), or a combination or stack thereof. The thermal budget of the first and second ILDs (112/134) will impact FeRAM module process details. After the deposition of the second interlayer dielectric (134) the preferred process is to planarize the dielectric preferably using CMP in order to make the surface flat for subsequent lithography process. Depending on the choice of back-end metallization there are multiple processing options. For etched Al metallization, the primary option is for Al or W vias. For damascene metallization (Al or Cu is preferable) there is the choice of dual damascene (via and metal filled at same time) or separate metal vias (Al, Cu or W) filled prior to single damascene metal. All of the process routes using vias and etched metal or single damascene metal (referred to as via first) are more similar with regards to FeRAM process details compared to dual damascene approach.

The process flow for via first is as follows. Depending on the metallization scheme such as Cu, a diffusion barrier/etch stop (typically silicon carbide, silicon nitride, silicon oxygen nitride, silicon carbo-oxy-nitride) will be deposited on the ILD. Lithography will then be used to form a patterned resist. The contact etch process will then etch through following stack: antireflection coating (if present), etch stop (if present), ILD, then sidewall diffusion barrier(s) which overlie the capacitor. It is likely that a different etch process (chemistry and plasma condition) will be used for each different material (not because the via depth is less above the contacts compared to in the periphery). In the preferred embodiment where the sidewall diffusion barrier is comprised of Si$_3$N$_4$ on AlOx, the Si$_3$N$_4$ can act as an etch stop for the ILD etch. This is a standard etch for applications like gate etch where there is a height difference in the ILD thickness between various etched regions. After the ILD etch, the Si$_3$N$_4$ and AlOx (which is exposed by the via hole) is subsequently etched either using the same or different chemistries. In general, all of the etch steps will be timed because of the small via area. However, endpointing through some realtime measurement (optical emission or gas phase RGA) is preferred. For FeRAM damage control it is especially important to control the bottom layer sidewall barrier etch process. It is preferred to use plasma conditions with smaller plasma damage and uniform etch rates with less overetch. After the via etch process, the resist is typically removed by an ash process followed by wet clean and dry.

It is preferred to perform an anneal process step (step 222) after via etch step to remove etch damage. For a PZT capacitor dielectric, this anneal is preferably performed around 500–650 C (furnace anneal is preferable for 15 min to 2 hr) or 550–700 C (RTA is preferable for 10 sec to 60 sec). Even more preferred is an RTA process at around 650 C for around 1 min. It is also preferred that the anneal be performed in an inert atmosphere (N$_2$ or Ar) so as not to oxidize the top electrode diffusion barrier. This option is preferred if the choice of interlayer dielectric is a low-K material with a maximum thermal budget of less than 500C. If the maximum thermal budget of the first or second ILDs (112/134) makes this impossible then it is preferred to use the maximum thermal budget possible for that ILD, using an RTA process.

Once the via has been formed it can be filled using the standard metallization. Typical metallizations and diffusion barriers have already been described but include metals of Cu, W, doped Al with barriers of Ta nitride or Ti/TiN. It is preferred to use a short plasma clean (Ar, Ar+N$_2$ for example) to clean the bottom of the via prior to deposition of the barrier and metal layers in a tool without any vacuum breaks between clean and deposition. For Cu, it is preferable to use Ta, TaNx or TiN barrier followed by Cu seed layer deposition. This is, preferably, followed by electroplated or deposited copper. The Cu and barrier above the interlevel dielectric is, preferably, removed by CMP. For W vias, it is preferable to use Ti/TiN barrier followed by CVD W and the excess tungsten is removed by etchback or CMP. For Al vias, a Ti/TiN barrier is followed by Al deposition (CVD, PVD with reflow, or hot PVD). The Al on top of the ILD is either removed or patterned and etched to form metal lines.

The via etch tool, post via clean, anneal tool, metal plasma clean and even barrier deposition tool can potentially become contaminated with FeRAM elements if the top electrode and PZT are not protected by a conducting hard mask and/or a diffusion barrier or sidewall diffusion barrier. Even with this protection, etch tool contamination might occur by process mistake, such as large over-etch. Therefore depending on the process control and significant monitoring, these tools can be shared instead of being dedicated. If the decision is that these tools need to be dedicated, then it might also be decided to use a backside wet clean process after the wafer leaves the last dedicated tool in order to eliminate any chance that FeRAM contamination might spread to other non-contaminated tools.

The process flow for dual damascene process flow is now described. The flow described here is the via first flow but many of the ferroelectric-specific aspects will also apply to the other process flow routes. Depending on the metallization scheme, such as Cu, a diffusion barrier/etch stop (preferably comprised of silicon carbide, silicon nitride, silicon oxygen nitride, silicon carbo-oxy-nitride) will be deposited on the ILD. Afterwards a second intermetal layer dielectric (IMD or ILD) is deposited using one of the choices described above (which is, sometimes, followed by another diffusion barrier/etch stop). Lithography is then used to pattern the vias. The vias are then etched using the same procedure as described above but this time there are potentially multiple layers of dielectrics prior to reaching the sidewall diffusion barrier. In addition, the aspect ratio of the first (deep) via for the dual-damascene approach is larger than with just a via. After the resist ash, via etch and clean, the first vias are filled with resist and lithography for the metal pattern is performed. The metal pattern is etched into the top dielectric and the depth is either controlled during the etch process or by an etch stop. The resist is then removed and etch debris removed by wet clean.

The next step is to perform a post etch recovery anneal and now the thermal budget is limited by more dielectric layers. For a capacitor dielectric comprised of PZT, this anneal is preferably around 500–650 C (for a furnace anneal of around 15 min to 2 hr) or 550–700 C for RTA process of around 10 sec to 60 sec). Even more preferred is an RTA process at around 650 C for around 1 min. It is also preferred that the anneal be performed in an inert atmosphere ($N_2$ or Ar) so as not to oxidize the top electrode diffusion barrier. This option is preferred if the choice of interlayer dielectric is a low K material with a maximum thermal budget of less than 500 C. If the maximum thermal budget of the ILD makes this impossible then it is preferred to use the maximum thermal budget possible for that ILD using RTA process.

The next step is to deposit the barrier and metal to simultaneously fill depressions for vias and for metal lines. Typical metallizations and diffusion barrier have already been described but for a damascene process these include Cu, W and doped Al with barriers of Ta, TaNx, or Ti/TiN. It is preferred to use a short plasma clean (Ar, Ar+$N_2$ for example) to clean the bottom of the via prior to deposition of the barrier and metal films in a tool without any vacuum breaks between clean and deposition.

The contamination issues with a dual damascene approach are similar to that of via first approach.

Interconnect 136 is formed so as to provide the electrical connection to the top electrode. The interconnect is connected to conductor 144 which is, preferably, connected to drive line 140. Drive line 140 is preferably brought to a potential around 1.2 volts during the operation of the device and this voltage will be scaled with the logic technology generation used.

Figure 2:
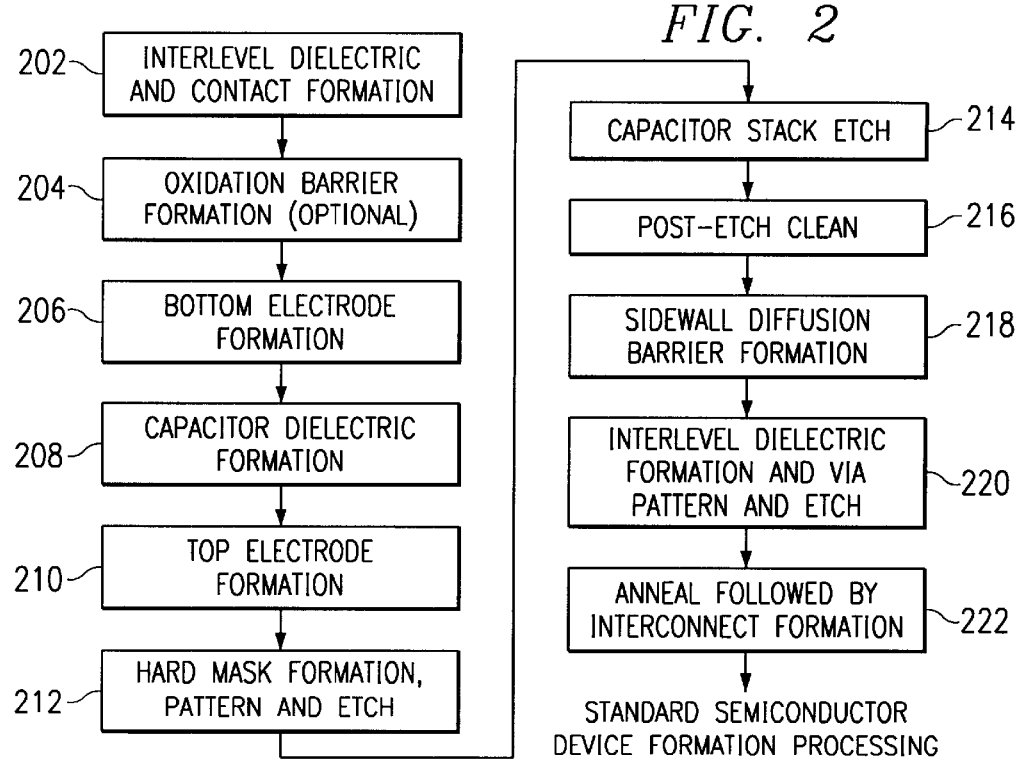
FIG. 2 is a flow diagram illustrating the process flow of one embodiment of the instant invention.
Figure 3A:
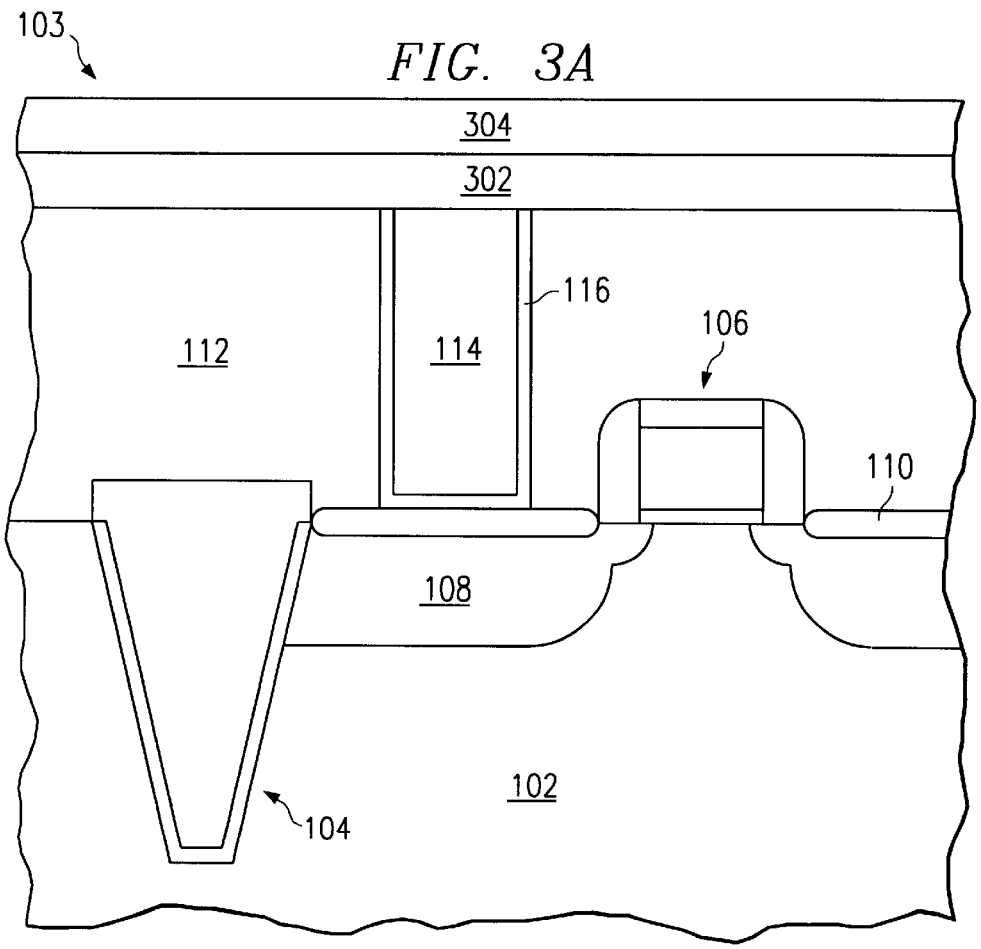
Figure 3B:
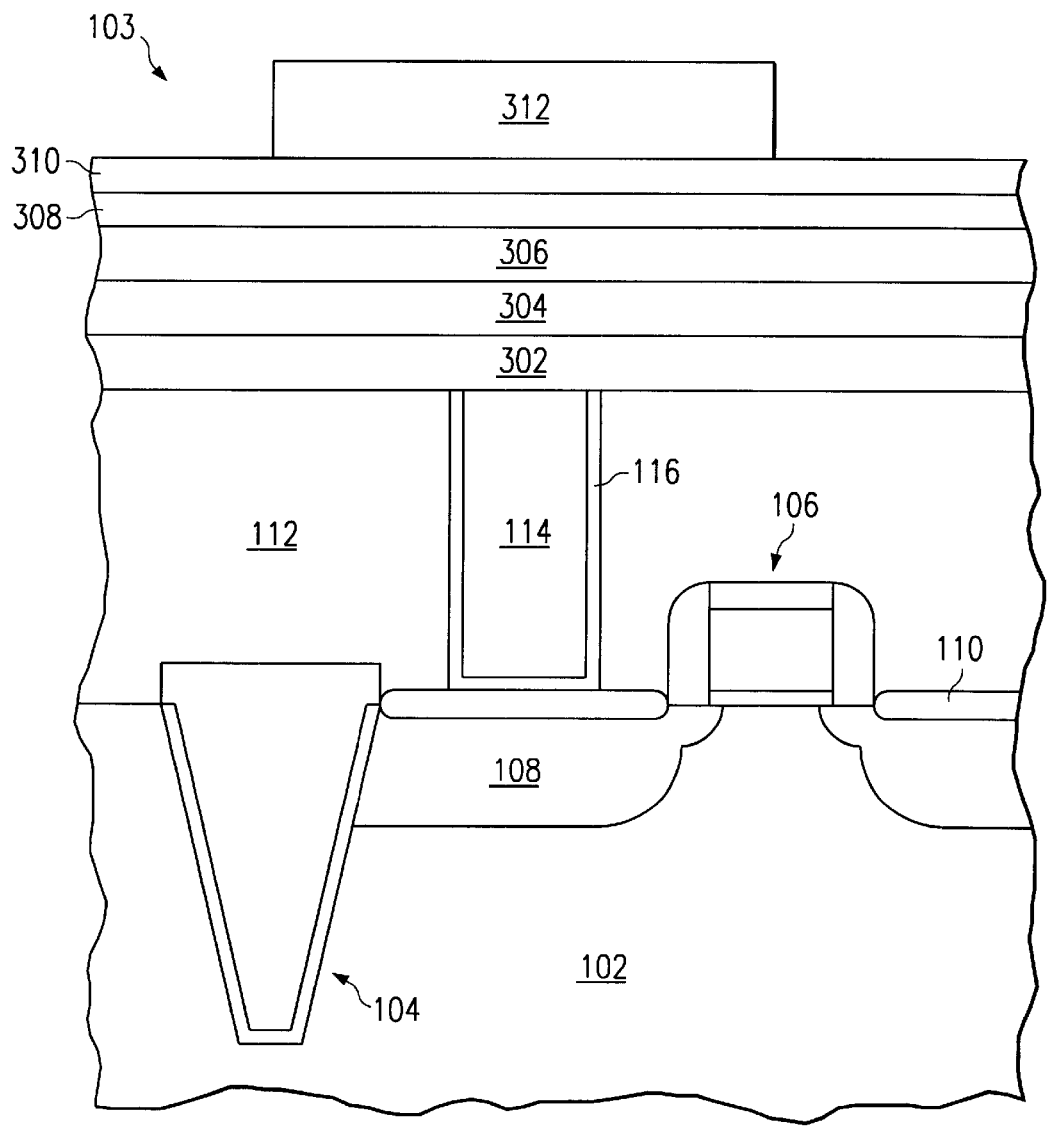

The following description of one embodiment of the instant invention revolves around the process flow as is illustrated in FIG. 2 and the cross-sectional view of memory device 103 as is illustrated in FIGS. 3a–3c. The features in FIGS. 3a–3c that are designated with the same reference numerals as though in FIG. 1 represent like or similar features.

Referring to FIG. 3a and process step 202 of FIG. 2, interlevel dielectric layer 112 is formed and planarized (if necessary) using standard semiconductor processing techniques. A photoresist layer (not shown) is formed and contact holes are etched into interlevel dielectric layer 112. After the photoresist is removed, barrier/liner layer 116 is blanketly formed (preferably using chemical vapor deposition, CVD). Next, conductive material is blanketly formed so as to fill the remainder of the contact hole. The portions of conductive material and liner/barrier layer which overlie interlevel dielectric layer are either etched back or polished back using chemical-mechanical polishing (CMP) so as to form plug 114 and liner/barrier 116. It is preferred to use a CMP process so that the surface is as planar as possible. An etchback process might result in a depression which would cause topography for subsequent processing. The topography might result in degraded local crystalline texture in ferroelectric layer which might result in degraded capacitor properties.

Referring to step 204 of FIG. 2, a two layer oxidation barrier layer 302 is, optionally, formed. First, TiN (preferably around 50 nm) is deposited using CVD (standard semiconductor industry process) followed by TiAlN (preferably around 30 nm) which is, preferably, deposited by reactive sputter deposition in Ar and $N_2$. The preferred composition of the TiAl target is $Ti_{0.6}Al_{0.4}$ and the deposition process is preferably performed at around 350 C (wafer temperature) in an Ar and $N_2$ (preferred ratio of around 40/60) with a sputter power set to achieve a deposition rate of around 50 nm/min. Layer 302 (122) should be formed if the resistivity of conductor 114 is adversely affected by diffusion of oxygen into the conductor during a oxygen-containing processes such as MOCVD deposition of the ferroelectric capacitor dielectric or oxygen annealing of the ferroelectric.

Bottom electrode material 304 (124) is formed, next, in step 204. Bottom electrode material 304 may be comprised of one or more layers depending on the dielectric material 306 used to form this capacitor. In this embodiment, layer 304 is preferably comprised of around 20 nm of Ir deposited by sputter deposition below 30 nm of IrOx deposited by reactive sputter deposition in an Ar and $O_2$ atmosphere. It is preferred to deposit the Ir and IrOx in the same deposition chamber for cost of ownership reasons. The deposition is preferably performed with a wafer temperature of around 300 C in Ar with a sputter power set to achieve roughly 50 nm/min, which is immediately followed by changing the gas atmosphere to Ar+$O_2$ (30/70) and adjusting the sputter power to achieve roughly 30 nm/min deposition rate of IrOx. An alternative preferred embodiment involves an Ir layer, which is preferably around 100 nm thick or less—more preferably around 50 nm of Ir, as the bottom electrode.

It is preferred that the TiN be deposited in a shared tool and the TiAlN be deposited in a dedicated tool that is clustered to an Ir and/or IrOx deposition chamber. It is also preferred that the Ir and IrOx be deposited in the same chamber in order to reduce cost of ownership. If the TiN is exposed to air prior to TiAlN deposition then it is preferred that either a vacuum or inert gas anneal and/or plasma clean (with approximately 1 nm TiN being removed) be performed prior to deposition of the TiAlN.

Referring to FIG. 3b, capacitor dielectric layer 306 is formed in step 208. Preferably, layer 306 (126) is comprised of less than 100 nm (50 nm is even more preferred) of PZT which is formed using metal-organic CVD (MOCVD). However, another technique such as chemical solution deposition (sol-gel or metal organic decomposition) can also be used. In addition, the preferred Zr/Ti composition is around 20/80 to obtain good ferroelectric switching properties (large switched polarization and relatively square looking hysterisis loop). Alternatively, a Zr/Ti composition of around 65/35 may be preferred in order to minimize switched polarization and uniformity in capacitor properties. Additionally, it is preferred to have donor doped PZT with roughly 0.5 to 1% donor dopant. The donor dopant improves the reliability of the PZT by helping to control the point defect concentrations. The MOCVD process conditions is preferably preformed at a temperature less than around 600 C (even more preferred to be less than 550 C). The deposition rate of the PZT is set to be between 100 and 200 nm/min. In order to have reproducible control of film composition, the MOCVD process may use two or even one cocktail of metalorganic precursors mixed together with a solvent to keep it a liquid. The MOCVD reactor is designed to vaporize the liquids with either one or two vaporizers and precisely control the reactor wall temperatures to prevent the precursors from either decomposing or condensing. An Ar or He carrier gas is, preferably, used to flow the precursors to the reactor chamber or showerhead where they are mixed with an oxidizer ($O_2$, $N_2O$, or $H_2O$, with $O_2$ preferred).

In step 210, the top electrode 308/310 (128/130) is formed. For PZT capacitor dielectrics, the preferred top electrode stack is comprised of approximately 10 nm Ir deposited by PVD in Ar on approximately 20 nm IrOx deposited by reactive PVD in Ar and $O_2$ which is formed on top of the PZT capacitor dielectric. It is preferred to deposit IrOx at a temperature below 400 C in gas mixtures of between 50% and 80% $O_2$ with the rest argon with a relatively low sputter power and, hence, slow deposition rate (preferred to be around 20 nm/min). It is also preferred that the Ir and IrOx be deposited in the same chamber in order to reduce cost of ownership.

In step 212, a hardmask layer is formed, patterned and etched so as to form hardmask 312 (132). Preferably, the hardmask is comprised of a material that will not be appreciably etched during the subsequent etching of the capacitor stack. It is also beneficial if the hardmask material is conductive because it will facilitate in the making the electrical connection to the top electrode. Preferably, the hardmask is comprised of 200 nm of sputter deposited TiAlN (40% Al target, Ar+$N_2$ (50/50), 400 C wafer temperature). Alternatively the hardmask is comprised of 300 nm of $SiO_2$ on 50 nm of TiAlN where the $SiO_2$ is deposited by TEOS PECVD. Another embodiment of a hardmask stack is 30 nm of TiAlN on 120 nm of TiAl, which is formed on 20 nm TiAlO which is formed on 50 nm of TiAlN. All of these layers are, preferably, deposited by sputter deposition in the same chamber where the film composition is changed during the deposition by varying the gas composition (Ar+$N_2$ (50/50) for nitride, Ar for metal, and Ar+$O_2$ (90/10) or Ar+$N_2$+$O_2$ (85/10/5) for oxide). The TiAlN is, preferably, deposited at around 400 C with high power to achieve roughly 100 nm/min TiAlN deposition rate. The TiAlN can be replaced by TiN for all of these cases.

It is preferred to clean the backside of the wafer in order to prevent contamination of lithography tools. The wet etch process is somewhat dependent on the materials present on the backside of the wafer (for example if it is Si, $SiO_2$ or $Si_3N_4$). Wet etching PZT may require either a strong fluorine acid or (even more preferred) an acid mixture with chlorine and fluorine etch chemistries, such as $H_2O$+HF+HCl or $H_2O$+$NH_3F$+HCl. This chemistry will also remove low levels of Ir that might be present on the backside/edge of the wafer.

Any conventional form of patterning can be used, but a photoresist mask is preferable. After the patterning mask is formed, the entire stack is etched (step 214) with this one mask. This etch, therefore, needs to etch the hardmask, top electrode, PZT, bottom electrode and bottom electrode diffusion barrier. There are two preferred etch approaches.

The first etch approach uses one high-density plasma etch chamber to etch all of these layers using the following process sequence in the same chamber. In each case the remote plasma density is set to near maximum power. The hardmask is first etched using chlorine chemistries (unless a $SiO_2$ hardmask is used, in which case a fluorine and chlorine chemistries are used). An example TiAlN etch recipe is comprised of a $Cl_2$ and $N_2$ (80/20) etchant with a pressure around 10 mTorr and medium substrate bias. If TiAlOx is part of the hardmask then a short high power step will preferably be added so as to break through this layer. After etching the hardmask, the resist is removed using $O_2$ and $N_2$ (85/15) at a pressure around 40 mTorr and a small substrate bias. The Ir/IrOx top electrode is, preferably, etched using a $Cl_2$+$N_2$+$O_2$ chemistry (60/20/20) at high bias (around 100 nm/min etch rate) at lower pressures (around 3 mTorr). The oxygen is added to insure a high selectivity between the Ir etch and the TiAlN hardmask etch. The PZT is etched in a reactive chemistry containing chlorine and fluorine (for example $Cl_2$+$CF_4$+$N_2$+$O_2$ (45/15/20/20)) at intermediate pressures (around 10 mTorr) and a high substrate bias (around 100 nm/min etch rate). Again, the oxygen is added to insure good selectivity between PZT etch rate and hardmask etch rate and also to minimize oxygen loss from the PZT. The bottom electrode is, preferably, etched with the same recipe as top electrode. The TiAlN bottom diffusion barrier is, preferably, etched with a two-step recipe. The etchant includes $Cl_2$ and $N_2$ (80/20). The pressure is, preferably, around 10 mTorr, and the etch starts out with a short high power short time step (approximately 30 nm removal) followed by a low power etch step with ~100% overetch time.

The second etch approach uses a high temperature etch process to etch low volatility species near room temperature such as Ir, IrOx and PZT. The process sequence is therefore listed below. For an $SiO_2$ hardmask, the $SiO_2$ is first etched in a dedicated $SiO_2$ etch chamber (fluorine chemistries only) using standard $SiO_2$ etch chemistry. The resist is then removed using standard ash process (such as $O_2$+$N_2$+$H_2O$+ optional $CF_4$). The TiAlN (underneath the $SiO_2$) will be etched in the high temperature etch chamber prior to the Ir preferably using similar chemistries and powers as discussed before but with a higher pressure (15–20 mTorr). For a TiAlN hardmask, a near room temperature etch chamber is used with process conditions similar to those discussed above. The resist can be removed in that chamber or in a dedicated chamber as well. The Ir/IrOx top electrode, PZT, IrOx/Ir bottom electrode and TiAlN bottom electrode diffusion barriers will be etched at high temperature using etch recipes similar to that discussed at room temperatures except the chamber pressure will be between 10–20 mTorr.

It is preferred that the wafers next be cleaned by immersing the wafer in a tank with a megasonic clean of DI $H_2O$ or dilute acid (for example $H_2O$+$NH_4F$+HCl (500:1:1)) for 5 min followed by DI $H_2O$ spin-rinse-dry. Alternatively a spray acid (water) tool can be used.

The next process involves the sidewall diffusion barrier 314/316 (118/120) deposition (step 218). An advantage of this layer is that if it is comprised of a dielectric material, and the contact which is formed to contact the top electrode is slightly misaligned this could short the two electrodes of the capacitor but for this insulative diffusion barrier layer. In this embodiment of the instant invention, the diffusion barrier is comprised of a layer 316 (118) of aluminum oxide and a layer 314 (120) of silicon nitride. Other barrier layers can be used, but this combination of layers seems to provide the best diffusion barrier properties while not adversely affecting the capacitor stack or the necessary anneal steps which follow. The preferred approach is to deposit AlOx (15–50 nm or more preferably 30 nm by PVD or 20 nm by MOCVD). Sputter deposition of AlOx will, preferably, be performed using pure Al target with pulsed DC power supply using $Ar+O_2$ (92/8) at 300 C wafer temperature with a low deposition rate (less than 15 nm/min).

It is preferred that the ferroelectric capacitor etch tool, wet bath, spin rinse dry and sidewall diffusion tool be dedicated for the FeRAM process module and not be shared in order to prevent cross contamination. It is preferred not to dedicate equipment so s to be only used in the fabrication of FeRAM structures and nothing else, and it is recommended that contamination tests be performed on all but the etch tool to verify that tools cannot be shared.

It is preferred to clean the backside of the wafer in order to prevent contamination of subsequent dielectric deposition tools. The wet etch process is somewhat dependent on the materials present on the backside of the wafer (for example if it is Si, $SiO_2$ or $Si_3N_4$). Wet etching PZT typically requires either strong fluorine acid or even more preferred an acid mixture with chlorine and fluorine etch chemistries such as $H_2O+HF+HCl$ or $H_2O+NH_3F+HCl$. This chemistry will also remove low levels of Ir that might be present on the backside/edge of the wafer.

The next preferred step is deposition of a thin $Si_3N_4$ etch stop (around 15–50 nm more preferably 20 nm) by PECVD with preferable process of $SiH_4+N_2$ (1–100 flow rate).

There are many possible interlayer dielectrics (ILD) that can be deposited above the capacitor. The goal of the FeRAM process module is not to restrict this choice but to allow the process flow to use whichever is best for the rest of the device (logic section for example). However, if PZT is used, this limits the thermal budget (after the PZT deposition) to less than around 600 C. Otherwise the choice will make not difference.

If the maximum thermal budget after ILD deposition is less than 600 C, then it is preferred to perform an anneal after AlOx deposition (600 to 650 C if possible in $O_2$ for 60 sec by RTA).

After ILD deposition the sample is planarized preferably by CMP.

There are many possibilities in the choice of backend metallization. Again, the goal of the FeRAM process module is to not restrict this decision but to allow the process flow to use whatever is the best for the rest of the device such as logic part. This choice impacts the FeRAM process module if it impacts the thermal budget after via etch and by the via etch process itself. Two backend metallization strategies will be discussed. Two choices include a W via with Al metallization and the second includes a Cu dual-damascene process with a low-K dielectric (low thermal budget).

For the example of W vias and Al metallization, it is preferable if the ILD above the capacitor can tolerate a thermal budget of greater than 600 C.

After CMP planarization, lithography is performed to pattern the vias. The vias are then etched using a four step etch (antireflection coating etch, ILD etch, $Si_3N_4$ etch, and AlOx etch). Except for the AlOx etch, this is a standard via etch process. The preferred AlOx etch process uses a high density plasma with large DC bias at low pressures (~5 mTorr). The $AlO_x$ and $Si_3N_4$ etch process are tuned to achieve uniform and repeatable etching over the wafer. This minimizes the amount of overetch that is needed. It is important that this etch stop at the top surface of hardmask 312/132 or etch only partially into hardmask 312/132. Endpoint detection of the etch steps is preferred. After via etch the wafers are cleaned using standard via clean process, which is typically a solvent clean followed by DI spin/rinse/dry.

In step 222 and prior to the conductor 132 and liner 138 formation, the anneal of the instant invention is performed so as to remove damage introduced by the capacitor stack processing (such as the ferroelectric material etch, encapsulation, and contact etch) into the capacitor dielectric and to improve the electrical properties of these features. If this anneal is not done at this point (i.e., if the anneal is done with the PZT stack exposed on its sidewalls), then it will result in the loss of Pb near the perimeter of each capacitor. This loss in Pb in the PZT film will result in the degradation of the electrical properties of small capacitors (capacitors with large perimeter to area ratios) after the capacitor integration. The anneal of the instant invention is, preferably, performed after the interlevel dielectric is formed and the via holes patterned and etched, but prior to the filling of the vias with the conductive material. The anneal conditions are: around 400 to 800 C (more preferably around 500 to 700 C—most preferably around 600 C) for a duration of around 30 seconds to 5 minutes (more preferably for around 1 to 4 minutes—most preferably around 2 minutes) in an inert atmosphere such as Ar, $N_2$ or vacuum. If the ILD thermal budget does not allow this then it is preferred to anneal using as much of the available thermal budget as possible by RTA.

A diffusion barrier liner is then deposited by sputter deposition of TiN on Ti after a sputter clean of the via using Ar or $Ar+H_2$.

It is preferred that none of these tools be dedicated. But if contamination tests show FeRAM contamination on clean wafers processed through these tools, then all of the tools after contact etch that are contaminated need to be dedicated and a wafer backside clean to remove FeRAM contamination needs to be performed at this point in the process flow.

If used, CVD W is then deposited to fill the via and CMP or etchback is used to remove W from the top surface. Al metallization is then deposited. This is preferably comprised of a stack of TiN on Al (Cu doped), which is on TiN, which is situated on Ti. The Al is then patterned and etched. All subsequent processes are not impacted by the FeRAM process module. In particular it is preferable if a forming gas anneal is used in the metallization process steps or at the end of the process flow since this anneal will in general be at less than 500 C.

For a specific example of Cu dual damascene with a low K dielectric (low thermal budget), a maximum thermal budget of 450 C is preferred after the deposition of the ILD above the capacitor. It is preferred that an anneal was performed as described previously after the sidewall barrier deposition in order to remove capacitor etch damage.

After CMP, a thin etch stop (15 nm) of SiCON is deposited by CVD followed by deposition of a low-K, low thermal budget IMD, followed by deposition of another thin (15 nm) etch stop of SiCON. Lithography is then used to pattern vias. The via etch should then etch through the following layers: antireflection coating (if present), SiCON, IMD, SiCON, ILD, Si3N4, then AlOx. Details of the Si3N4 and AlOx have already been discussed. The resist is then removed and the vias cleaned (preferably using wet process). Next lithography is used to pattern the metal features. The metal etch then etches preferably only through antireflection coating (if present), SiCON and IMD thereby stopping on the lower SiCON layer. The resist is then removed and metal and vias are cleaned. It is preferable to perform an anneal with maximum thermal budget available either after via etch clean or after metal etch clean in $N_2$ or preferred inert gas. The next step is metal deposition which consists of a plasma clean followed by deposition of a TaNx seed layer, Cu seed layer and then electroplate or deposition of Cu to fill the vias. The Cu and TaN are removed from above the IMD by CMP.

It is preferred that none of these tools be dedicated. But if contamination tests show FeRAM contamination on clean wafers processed through these tools, then all of the tools after contact etch that are contaminated needs to be dedicated and a wafer backside clean to remove FeRAM contamination needs to be performed at this point in the process flow.

Hardmask Formation Embodiment

Hardmask 312 is, preferably, comprised of multiple layers. Preferably, the hardmask 312 is comprised of three layers, a top layer, a middle layer and a bottom layer. The top layer is preferably comprised of a material that will withstand the etching of top electrode 310/308, ferroelectric material 306, and bottom electrode 304 so that the top layer of the hardmask will act as the hardmask for the etching of those layers. The middle layer of the hardmask is preferably comprised of a material that will withstand the etching of diffusion barrier layer 302 so that it, and the top layer of the hardmask if it is not completely etched away, will act as the hardmask during the etching of diffusion barrier layer 302. The top and middle layers of the hardmask may or may not be completely removed during the patterning and etching of layers 302, 304, 306, 308, and 310 to form the capacitor stack. However, the bottom layer of the hardmask will, preferably, remain intact to some extent, after the etching to form the capacitor stack. The bottom layer of the hardmask is, preferably, comprised of a material which will: act as an additional hydrogen barrier with respect to the top electrode; act as an etch stop layer during the subsequent sidewall diffusion barrier etch back process and contact formation process; encapsulate, at least partially, the top electrode to minimize cross contamination; and reduce the risk of exposing the ferroelectric material during subsequent contact etching, when there is any misalignment. Preferably, the bottom layer of the hardmask is comprised of TiAlN and is on the order of 10 to 100 nm thick, more preferably around 20 to 75 nm thick—most preferably around 50 nm thick. The middle layer of the hardmask is comprised of $TiAlO_x$, TiAlON, $SiO_2$, SiN, $AlO_x$, Ir, $IrO_2$, Pt, or any stack or combination thereof and its thickness is determined by the thickness and composition of layer 302 and the etch selectivity between the middle layer compared to layer 302 for the etchant used to etch layer 302. Preferably, the thickness is on the order to 10 to 50 nm—more preferably around 20 to 40 nm, most preferably around 30 nm. The top layer of the hard mask is comprised of TiAlN, Al, AlN, $SiO_2$, SiN, or any stack or combination thereof and has a thickness on the order of 10 to 400 nm, more preferably around 50 to 300 nm—most preferably around 100 to 200 nm. In addition, a thin layer of a hard-to-etch material, such as $Al_2O_3$, may be formed on the top layer of the hard mask, and under a BARC layer—if it is formed, if the patterning photoresist layer is not thick enough to withstand the hardmask stack opening etch.

Hydrogen-Free Contact Etch Embodiment

In essence, this embodiment of the instant invention is a novel etch chemistry and set of process conditions for the etching of the contact opening used to connect the top electrode (layers 128 and 130 of FIG. 1) of the ferroelectric capacitor to the drive line (drive liner 140 of FIG. 1) and to connect level 169 conductors or semiconductors of FIG. 1 to level 170 metallization of FIG. 1. In this embodiment of the instant invention, $AlO_x$ and/or AlN are deposited as two of the three layers that make up the diffusion barrier and can be, optionally, etched back to form sidewalls on the capacitor stack. Preferably, another of these layer is comprised of silicon nitride. The method and etchant of this embodiment of the instant invention involve a hydrogen-free etchant for etching the contact to the top electrode (i.e. etching through the silicon nitride layer and the AlOx and/or AlN layers). In addition, this etchant and etch process should be fairly selective to TiAlN so that at least a portion of this layer remains intact on the top electrode after the contact etch of the instant invention. More specifically, the etchant (for etching the diffusion barrier layers and the BARC layer to form the interconnects) of this embodiment of the instant invention is comprised of: $CF_4$, $C_2F_6$, $C_4F_8$, $C_5F_8$, $CF_y$, $NF_3$, or any combination thereof and is preferably incorporated into a high-density plasma. This etchant may, additionally, be comprised of: Ar, $N_2$, $O_2$, $O_3$, CO, $N_2O$, or any combination thereof.

Method and Etchant to Pattern Capacitor Stack

In essence, the invention of this embodiment of the instant invention involves providing an etchant and etch process for etching the capacitor dielectric that incorporates some or all of the following: optimizing the etchant to provide a favorable capacitor dielectric (preferably PZT) to hardmask (preferably comprised of TiAlN) etch selectivity; using a higher bias power to increase the etch rate of the capacitor dielectric layer; using a chlorine-containing species in the etchant to increase the etch rate of the capacitor dielectric layer; using an oxygen-containing species in the etchant to decrease the etch rate of the hard mask, although, this may also slow down the etch rate of the capacitor dielectric layer; and using a fluorine-containing species in the etchant to increase the etch rate of the capacitor dielectric. In another embodiment of the instant invention, one or more of the following gases can be used in conjunction with the chlorine-containing species (preferably $Cl_2$) in the etchant or in place of it: $BCl_3$, $NCl_3$, $CCl_4$, $C_xCl_y$, $SiCl_4$, or any combination thereof. Similarly, one or more of the following gases can be used in conjunction with the oxygen-containing species (preferably $O_2$) in the etchant or instead of it: $O_3$, $N_2O$, CO, $CO_2$, or any combination thereof. Additionally, one or more of the following gases can be used in conjunction with the fluorine-containing species (preferably $CF_4$) in the etchant or in place of it: $NF_3$, $C_xF_y$, or any combination thereof.

Conductive Plug Planarization Process

Figure 4:
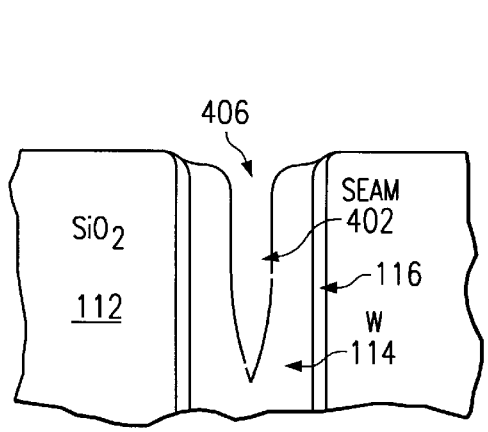
FIG. 4 is a cross-sectional view of a portion of a partially fabricated device illustrating a problem with a conductive contact.

In order to inexpensively integrate embedded FeRAM devices on a standard semiconductor chip, standard semiconductor processing and structures should be utilized as much as possible. At present, contacts to the underlying source, drain and gate structures are formed using plugs, such as plugs 114, of tungsten or tungsten silicide. As can be seen in FIG. 4, a common problem with tungsten plugs are that there are voids 402 (seams and voids in the via will be collectively referred to as "voids" hereinafter) formed in the tungsten during the CVD tungsten process. In addition, a recess 406 forms in the surface of tungsten plug material 114 during the removal of excess tungsten. The recess creates a non-planarity. A planar surface is desirable for FeRAM capacitor fabrication for several reasons. First, the grain size, crystallographic texture, thickness and composition of the films making up the capacitor stack will be more uniform when formed on a planar surface. Second, large variations in the topography of the structures underlying the capacitor can cause the conducting diffusion barrier and bottom electrode to cease to act as effective barriers. This will result in the degradation of the tungsten plug due to the diffusion of oxygen into the tungsten. Oxidation of the tungsten occurs rapidly and results in an increased resistivity and a dramatic increase in the volume of the tungsten plug.

In essence, the embodiments of the instant invention utilizes one or more of the conductive materials used in the fabrication of the standard semiconductor devices or a material that is used or can be used in the fabrication of the ferroelectric memory device to fill the void in the tungsten and the recess in the surface of the tungsten plug. The description of the instant invention follows with reference to the embodiments of FIGS. 5, 6a–6c, 7a–7d, 8a–8d, and 9a–9e.

Figure 5:
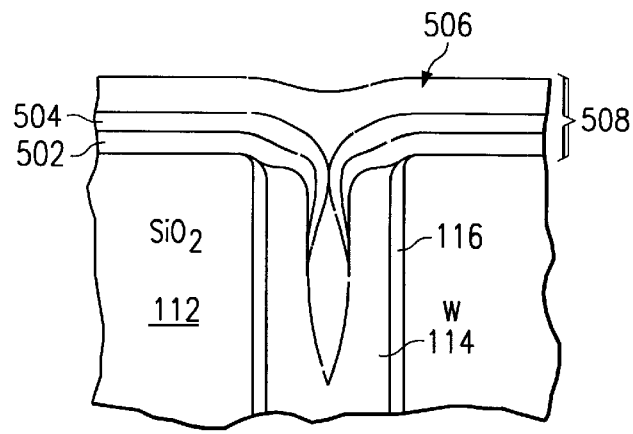
FIG. 5 is a cross-sectional view of a portion of a partially fabricated device illustrating the improved contact of one embodiment of the instant invention.

One embodiment of the instant invention involves forming a thicker layer of conductive diffusion barrier material 302, shown as layer 122 in FIG. 1. In FIG. 5 conductive barrier layer 508 is illustrated as comprised of three layers, layers 502, 504, and 506. However, conductive barrier layer 508 may be comprised of layers of one or more materials. Preferably, barrier layer 508 is comprised of layers of one or more of the following: TiAlN, TiN, TaSiN, TiSiN, TaN, HfN, ZrN, HfAlN, CrN, TaAlN, CrAlN, or any other conductive diffusion barrier material listed above. The preferred deposition technique for these barrier layers is reactive sputter deposition using Ar+$N_2$ or Ar+$NH_3$. It should be noted that Ar is the standard inert gas used for sputter deposition based on cost and performance. It is possible to use other inert gases instead of Ar for this application. Other deposition techniques that might be used include CVD or plasma-enhanced CVD. If the conductive barrier layer 508 is comprised of only one material, preferably TiAlN with 30–60% Al, the thickness of layer 508 should be around or slightly less than twice the width, w, of void 402. The thickness of barrier layer 508 needed to cover the tungsten void 402 will scale with plug diameter. Table 2 illustrates a few preferred thicknesses for various seam widths.

TABLE 2

| Plug Diameter (µm) | Estimated Maximum Width of Tungsten Void (nm) | Estimated TiAlN Thickness Needed (nm) |
|---|---|---|
| 0.24 | 60 | 120 |
| 0.22 | 55 | 110 |
| 0.18 | 45 | 90 |
| 0.13 | 33 | 65 |
| 0.10 | 25 | 50 |

After the formation of layer 508, it can be polished back to form a cap (not shown) over void 402. However, it is preferable to use the process flow of FIG. 2, leave layer 508 intact and pattern and etch layer 508 with the rest of the capacitor stack. In other words, layer 508 is treated like layer 302 shown in FIGS. 3a–3c and is etched with the rest of the capacitor stack.

Figure 6C:
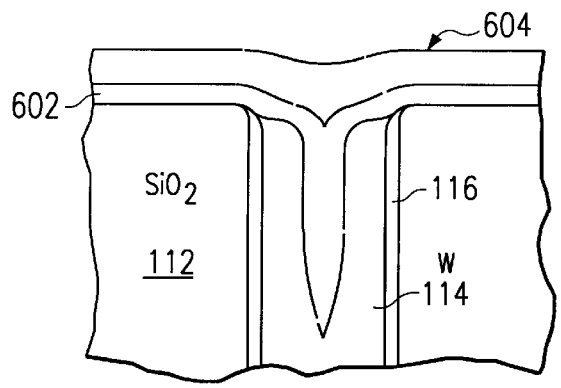
Figure 7A:
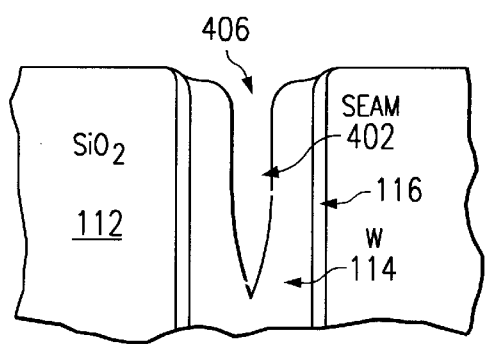
FIGS. 7a–7d is a cross-sectional view of a portion of a partially fabricated device illustrating the improved contact of another embodiment of the instant invention.
Figure 7B:
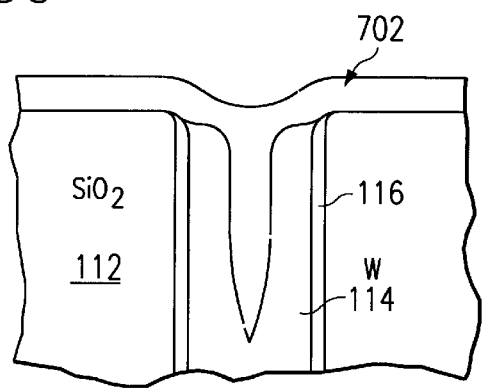
Figure 7C:
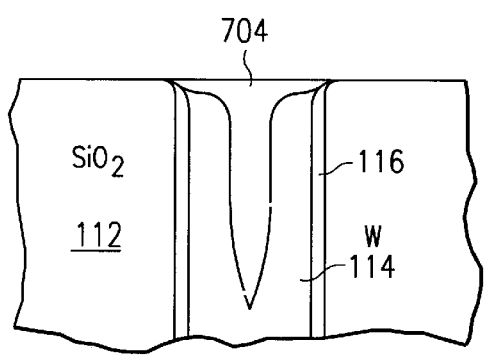
Figure 7D:
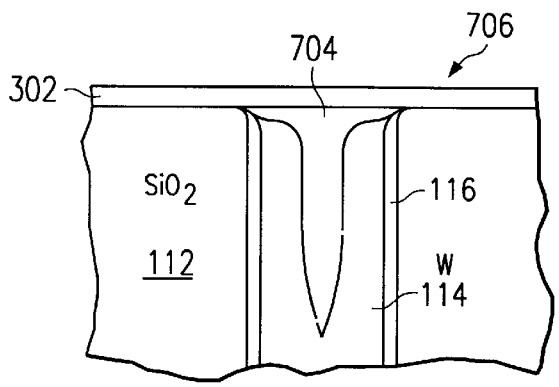
Figure 8A:
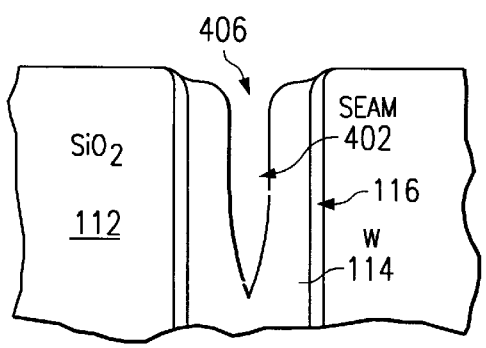
FIGS. 8a–8d is a cross-sectional view of a portion of a partially fabricated device illustrating the improved contact of another embodiment of the instant invention.
Figure 8B:
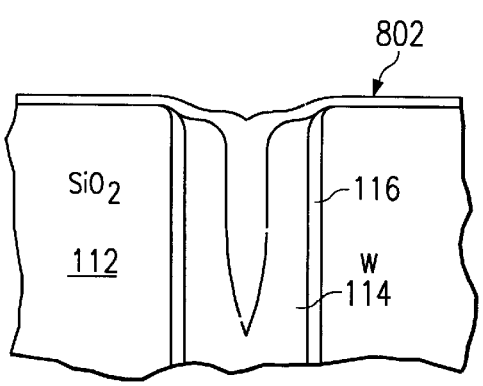
Figure 8C:
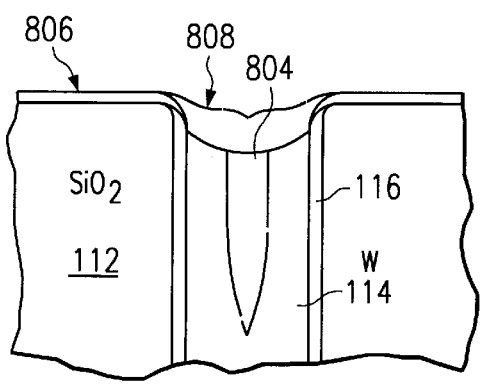
Figure 8D:
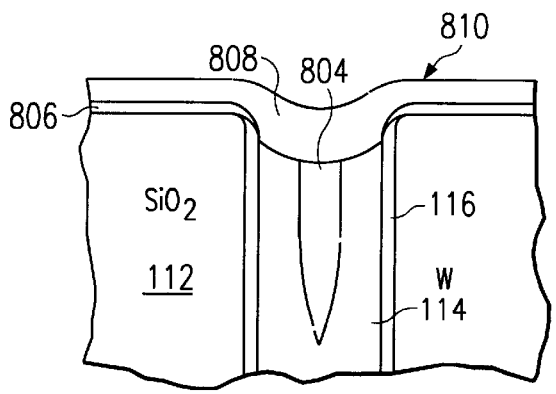

In an alternative embodiment illustrated in FIGS. 6a–6c, layer 602 (which may be comprised of one or more conductive materials) is used to fill void 402, while layer 604 is used as the conductive barrier layer. In this embodiment, layer 602 is, preferably, comprised of 10 to 100 nm, more preferably around 20 to 40 nm, of CVD TiN. However, layer 602 may be comprised of Ti, Ta, TaN, TiAlN, TaSiN, TiSiN, HfN, ZrN, HfAlN, CrN, TaAlN, CrAlN, $WSi_x$, $WSi_xN_y$, $TaSi_x$, $TiSi_x$, Ir, Pt, Ru, Pd, Rd, or any other conductive material, and it may be fabricated using PVD or CVD. In addition, if layer 602 is comprised of TiN, it is preferably deposited using an industry-standard CVD TiN process. It may, also, be fabricated by depositing Ti and then nitriding the titanium layer using an $N_2$ or $NH_3$ plasma or by a rapid thermal anneal in a nitrogen-containing ambient. If layer 602 is comprised of CVD TiAlN, then there may be no need to form layer 604, because CVD TiAlN will fill the void and has barrier properties sufficient to protect plug material 114 from the oxygen and lead used in subsequent anneals and/or ferroelectric material deposition. This would also be the case if layer 602 were comprised of any other material that has beneficial barrier properties (e.g., resistance to oxygen and/or lead diffusion).

Barrier layer 604 is deposited on layer 602, preferably either by CVD or PVD. Layer 604 is, preferably, on the order of 10 to 100 nm thick, more preferably around 10 to 50 nm thick—most preferably around 20 to 30 nm thick, and is, preferably, comprised of TiAlN, TaSiN, ZrN, HfN, or any material suitable for forming layer 302 of FIGS. 3a–3c or layer 122 of FIG. 1.

Preferably, the combination of layers 602 and 604 is etched in step 214 of FIG. 2. However, layers 602 and 604 may be polished back using CMP.

Referring to the embodiment of FIGS. 7a–7d, conductive material 702 is deposited over the entire wafer. Preferably, layer 702 is comprised of the same material as layer 602 of FIGS. 6a–6c and is deposited in a similar manner as layer 602. However, layer 702 is preferably a little thicker than layer 602 because layer 702 will, preferably, fill void 402 and recess 406. Hence, layer 702 is, preferably, on the order of 10 to 150 nm thick, more preferably on the order of 10 to 75 nm thick—most preferably around 50 to 75 nm thick. Layer 702 can be patterned and etched with the rest of the capacitor stack during etch operation 214. However, it is preferable to planarize or etch layer 702 back prior to the formation of conductive barrier layer 706. Preferably, a polishing operation is performed such that all of layer 702 that overlies dielectric layer 112 is removed, but not so much that a large amount of dishing occurs in the region of the contact. This polishing process forms region 704 of FIG. 7c. After this polishing step, a clean step may be performed. Next, the processing illustrated in FIG. 2 would continue with the formation of layer 706, which is equivalent to layer 302 of FIGS. 3a–3c and layer 122 of FIG. 1. Preferably, layer 706 will be thick enough, preferably around 5 to 75 nm—more preferably around 10 to 40 nm—most preferably between 20 and 30 nm, for layer 706 to act as a barrier that prevents oxygen and/or lead from getting to the plug or region 704.

Another embodiment of the instant invention is illustrated in FIGS. 8a–8d. A thin layer of silicon-containing conducting material 802 is formed. Preferably, silicon layer 802 is thick enough to completely fill void 402, and it is deposited using industry-standard CVD techniques. Next, the wafer is subjected to a thermal treatment so as to create a silicide region 808, preferably tungsten silicide when the conductive plug is formed of tungsten, in the portion of silicon layer 802 that overlies the tungsten plug. Preferably, the thermal treatment is accomplished at a temperature between 200 and 900 C, more preferably around 250 to 800 C—most preferably around 400 to 600 C, in a nitrogen-containing plasma, preferably $N_2$ or $NH_3$ incorporated into the plasma. However, lower temperatures can be used due to the plasma treatment. Alternatively, the plasma can be avoided if the temperature is in excess of 750 C. The resulting structure is comprised of a $WSi_xN_y$ silicide region 808, a silicon region 804, and a silicon nitride or silicon oxy-nitride region 806. However, part of region 804 may be silicide during this process. Barrier layer 810 is formed and is equivalent in thickness and material to layers 604 and 706.

Figure 9A:
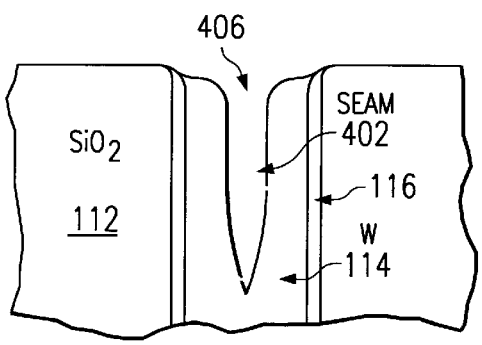
FIGS. 9a–9e is a cross-sectional view of a portion of a partially fabricated device illustrating the improved contact of another embodiment of the instant invention.
Figure 9B:
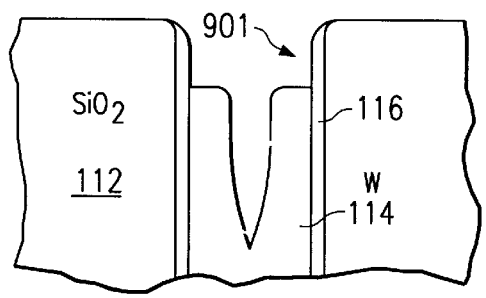
Figure 9C:
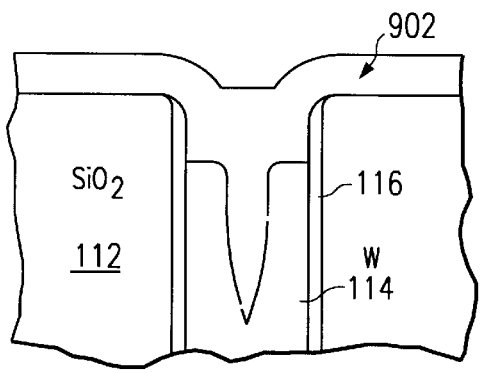

Referring to the embodiment of the instant invention as is illustrated in FIGS. 9a–9e, tungsten plug 114 is etched back, preferably around 20 to 300 nm below the top dielectric layer 112, more preferably around 50 to 100 nm. The result of this etch-back is illustrated in FIG. 9b as recess 901. This is, preferably, performed using a dry process, such as an $SF_6$ reactive etch. Forming the recess 901 with a wet etch process alone is difficult because the etchant tends to remove material from the bottom of the tungsten void 402 as well as from the top. This could remove the entire tungsten plug 114, rather than selectively recessing the W plug below the dielectric 112 as desired. The SF6 etch-back process, may be followed by a light wet etch step to remove any residual tungsten that may remain on the sidewalls of the via hole. This would, preferably, be accomplished with a dilute mixture of $H_2O_2$ and $H_2O$ or any other diluted standard tungsten metal etchant.

Next, a conductive barrier material 902, preferably TiAlN, TiSiN, TaN, TiN, CrN, CrAlN, TaSiN, ZrN, HfN, or any other conductive barrier material listed above, is deposited using CVD or PVD. Preferably, layer 902 is comprised of TiAlN and possesses a thickness greater than or equal to the depth of the recess 901 that remains following the W plug etch-back. This layer serves the same function as layer 122 in FIG. 1 and layer 302 in FIGS. 3a–3c.

Figure 9D:
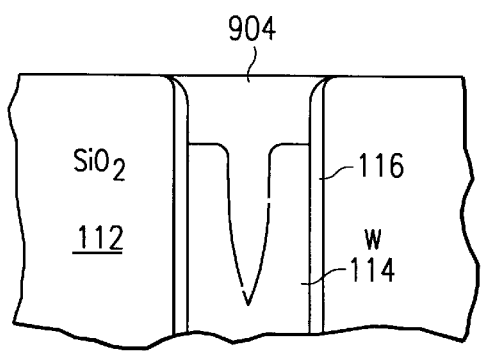
Figure 9E:
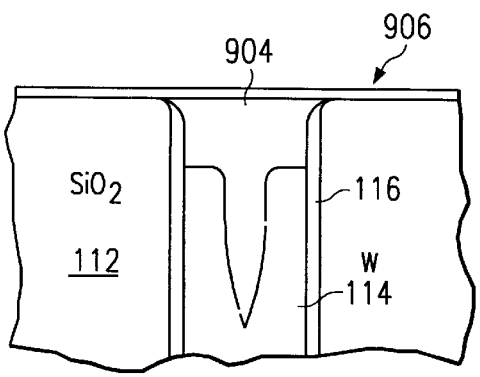

As illustrated in FIG. 9d, the barrier layer 902 is next planarized such that dielectric layer 112 is exposed and barrier structure 904 remains filling the recess 901. Planarization is performed using either a blanket etchback process or, preferably, a CMP process. Barrier structure 904 should have a thickness, preferably in excess of around 20 to 30 nm, sufficient to adequately protect the underlying tungsten plug 114 from oxidation and/or lead diffusion. It can be seen in FIG. 9d that only the upper surface of the barrier structure 904 is exposed, and the sidewalls of barrier structure 904 are protected by the oxide layer 112. Following planarization, bottom electrode material 906 is deposited as is described in step 206. Preferably, bottom electrode material is comprised of iridium and/or iridium oxide.

Pre-Conductive Barrier Formation Clean Process

Adhesion of the conductive barrier layer (illustrated as layer 122 in FIG. 1, 302 in FIGS. 3a–3c, layer 706 in FIG. 7d, layer 810 in FIG. 8d, and layer 906 in FIG. 9e) to the interlevel dielectric 112 (preferably comprised of silicon dioxide) after a CMP process may not be as strong as desired. In addition, the tungsten plug surface may not be sufficiently clean after the CMP process. Hence, a problem may exist with the conductive barrier layer adhering to the underlying structure in addition to a potential problem with the electrical connection of the barrier layer to the plugs. In this embodiment of the instant invention, a clean process is performed prior to the formation of the conductive barrier layer.

In one embodiment of the instant invention, a higher-temperature thermal anneal is performed using an inert ambient and/or an ambient which includes a reducing gas ambient. However, this thermal anneal may be performed in a vacuum. Preferably, the inert ambient is comprised of Ar or $N_2$ and the reducing gas is comprised of Ar and $H_2$, $N_2$ and $H_2$, $CH_4$, or $H_2$. Preferably, the anneal temperature is around 500 to 1000 C, more preferably around 600 to 750 C. This anneal helps desorb moisture and hydrocarbons from the surface of the interlevel dielectric 112 and tungsten plug 114, and results in improved adhesion and a lower contact resistance. Use of a reducing gas such as $N_2+H_2$ (commonly known as forming gas) will more effectively reduce any tungsten oxide ($WO_x$) layer that may be present on the surface of the W contact plug 114, resulting in even lower contact resistance. Anneals in a $N_2$ ambient can form a conducting tungsten nitride (WN) layer at the surface of the tungsten contact plug. In some cases, the WN surface layer is desirable in that it can lead to further improvements in adhesion and contact resistance.

In an alternative embodiment, the interlevel dielectric layer and the tungsten surfaces are cleaned using a plasma that incorporates an inert gas and/or a reducing gas ambient. Preferably, the inert gas is comprised of Ar or $N_2$ and the reducing gas is comprised of Ar and $H_2$, $N_2$ and $H_2$, $CH_4$, or $H_2$. In addition to cleaning these surfaces, the plasma will additionally improve adhesion roughening in the surfaces of the interlevel dielectric layer and the tungsten plug. In addition, the surface of the interlevel dielectric will be reduced, allowing stronger chemical bonds to form. A plasma anneal in $N_2$ will also provide a conducting tungsten nitride layer at the surface of the tungsten contact plug. As described above, this will have beneficial effects on adhesion and contact resistance.

In another embodiment, both the thermal anneal cleaning step and the plasma-assisted cleaning steps are performed. These steps can be performed using a variety of process sequences and the gas ambient combinations described above.

In an additional embodiment, a low-temperature oxygen plasma anneal (preferably at less than 400 C) can be carried out, first, to remove hydrocarbons from the interlevel dielectric 112. This process step is then followed by a high temperature anneal in an inert (preferably Ar or $N_2$) or reducing gas ambient (preferably Ar and $H_2$, $N_2$ and $H_2$, $CH_4$, or $H_2$), as described above. Alternatively, the first low temperature oxygen plasma treatment step is followed by a plasma treatment in a inert or reducing gas ambient, as described above.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of fabricating a planar conductive via in an opening through a dielectric layer having a top surface, a bottom surface and the opening having sides, said method comprising the steps of:

depositing a first conductive material on said top surface of said dielectric layer and in said opening in said dielectric layer to substantially fill said opening with said conductive material;

removing the portion of said first conductive material located on said dielectric layer;

depositing, by chemical vapor deposition, a first barrier layer over the remaining first conductive material in the opening, the first barrier layer extending over the top surface of said dielectric layer;

then forming a second barrier layer over the first barrier Layer, the second barrier layer acting as a diffusion barrier to prevent oxidation of said first conductive material and extending over the top surface of the dielectric layer;

depositing a bottom electrode layer over the second barrier layer;

depositing a layer of a ferroelectric capacitor dielectric material over the bottom electrode layer;

depositing a top electrode layer over the layer of ferroelectric capacitor dielectric material; and then etching the top electrode layer, layer of ferroelectric capacitor dielectric material, bottom electrode layer, and the second barrier layer, to define a capacitor at a location overlying the first conductive material in the opening.

2. The method of claim 1, wherein said second barrier layer is comprised of TiAlN, TaSiN, ZrN, or HfN.

3. The method of claim 1, wherein said first conductive material is comprised of: doped polycrystalline silicon, tungsten, titanium, titanium nitride, tantalum, tantalum nitride, copper, aluminum, or any combination or stack thereof.

4. The method of claim 1, wherein said first barrier layer is comprised of: TiN, Ti, Ta, TaN, TiAlN, TaSiN, TiSiN, HfN, ZrN, HfAlN, CrN, TaAlN, CrAlN, $WSi_x$, $WSi_xN_y$, $TaSi_x$, $TiSi_x$, Ir, Pt, Ru, Pd, Rd, or any combination or stack thereof.

5. The method of claim 1, wherein said second barrier layer is comprised of TiAlN.

6. The method of claim 1, wherein said step of forming the second barrier layer is performed by physical vapor deposition.

7. The method of claim 6, wherein said first barrier layer is comprised of TiN.

8. The method of claim 1, wherein the first barrier layer also extends over the top surface of the dielectric layer after the forming of the second barrier layer;

and wherein the etching step also etches the first barrier layer, to define the capacitor.

* * * * *

UNITED STATES PATENT AND TRADEMARK OFFICE
CERTIFICATE OF CORRECTION

PATENT NO.    : 6,635,528 B2
DATED         : October 21, 2003
INVENTOR(S)   : Stephen R. Gilbert, Scott Summerfelt and Luigi Colombo It is certified that error appears in the above-identified patent and that said Letters Patent is hereby corrected as shown below:

<u>Title page,</u>
Item [73], Assignee, please replace "Texas Instruments Incorporated, Dallas, TX (US)" with -- [73] Assignee: Texas Instruments Incorporated, Dallas, TX (US); Agilent Technologies, Incorporated, Santa Clara, CA (US) --.

Signed and Sealed this

Tenth Day of February, 2004

JON W. DUDAS
*Acting Director of the United States Patent and Trademark Office*